(12) United States Patent
Effros et al.

(10) Patent No.: US 12,119,932 B2
(45) Date of Patent: *Oct. 15, 2024

(54) SYSTEMS AND METHODS FOR COMMUNICATING USING NESTED LOW DENSITY PARITY CHECK CODES

(71) Applicant: California Institute of Technology, Pasadena, CA (US)

(72) Inventors: Michelle Effros, Pasadena, CA (US); Yuxin Liu, Pasadena, CA (US)

(73) Assignee: California Institute of Technology, Pasadena, CA (US)

( * ) Notice: Subject to any disclaimer, the term of this patent is extended or adjusted under 35 U.S.C. 154(b) by 367 days.

This patent is subject to a terminal disclaimer.

(21) Appl. No.: 17/146,343

(22) Filed: Jan. 11, 2021

(65) Prior Publication Data

US 2021/0218498 A1 Jul. 15, 2021

Related U.S. Application Data

(60) Provisional application No. 62/959,678, filed on Jan. 10, 2020.

(51) Int. Cl.
*H04L 1/00* (2006.01)
*H03M 13/11* (2006.01)

(52) U.S. Cl.
CPC ....... *H04L 1/0057* (2013.01); *H03M 13/1105* (2013.01); *H03M 13/1148* (2013.01); *H04L 1/0041* (2013.01)

(58) Field of Classification Search
CPC .............. H03M 13/63; H03M 13/1148; H03M 13/1105; H03M 13/6362; H03M 13/3761;
(Continued)

(56) References Cited

U.S. PATENT DOCUMENTS

2009/0150743 A1* 6/2009 Agarwal ............... H03M 13/13
714/751
2017/0141798 A1* 5/2017 Kudekar ............... H04L 1/0045
(Continued)

OTHER PUBLICATIONS

Amraoui et al., "Finite-Length Scaling for Iteratively Decoded LDPC Ensembles", IEEE Transactions on Information Theory, vol. 55, Issue 2, Feb. 2009, pp. 473-498, DOI: 10.1109/TIT.2008.2009580.
(Continued)

*Primary Examiner* — Oussama Roudani
(74) *Attorney, Agent, or Firm* — KPPB LLP

(57) ABSTRACT

Systems and methods in accordance with various embodiments of the invention enable communicating using nested Low Density Parity Check (LDPC) codes. A nested LDPC code is an LDPC code having a full blocklength, where shorter blocklengths of the nested LDPC code can be utilized as shorter blocklength LDPC codes. In certain embodiments, a transmitter utilizes a nested LDPC code to communicate via a point-to-point connection. In several embodiments, multiple transmitters utilize nested LDPC codes to communicate simultaneously via a Random Access Channel. One embodiment includes a transmitter capable of encoding a message as symbols using a nested LDPC code until a feedback message indicating an end of epoch message is received. A receiver can determine whether a decoding rule is satisfied at predetermined decode times and transmit an end of epoch message when the decoder can decode a message based upon the nested LDPC code.

10 Claims, 7 Drawing Sheets

(58) Field of Classification Search
CPC ....... H04L 1/0057; H04L 1/0041; H04L 1/16;
H04L 1/0045; H04L 2001/0092; H04L
1/0009; H04L 1/0036; H04L 2001/0093
See application file for complete search history.

(56) References Cited

U.S. PATENT DOCUMENTS

| | | | | |
|---|---|---|---|---|
| 2017/0237530 | A1* | 8/2017 | Wesel | H04L 1/22 375/295 |
| 2017/0331494 | A1* | 11/2017 | Richardson | H03M 13/116 |
| 2018/0226992 | A1* | 8/2018 | Panteleev | H03M 13/616 |
| 2018/0262303 | A1* | 9/2018 | Jia | H03M 13/2906 |
| 2019/0199475 | A1* | 6/2019 | Richardson | H03M 13/6505 |
| 2019/0379484 | A1* | 12/2019 | Li | H04L 1/00 |
| 2021/0013901 | A1* | 1/2021 | Li | H04M 13/6516 |
| 2021/0336719 | A1* | 10/2021 | Xin | H04L 1/1893 |

OTHER PUBLICATIONS

Amraoui et al., "Finite-length scaling of irregular LDPC code ensembles", IEEE Information Theory Workshop, Aug. 29-Sep. 1, 2005, pp. 6-10, DOI: 10.1109/ITW.2005.1531845.

Bennatan et al., "Design and analysis of nonbinary LDPC codes for arbitrary discrete-memoryless channels", IEEE Transactions on Information Theory, vol. 52, Issue 2, Feb. 2006, pp. 549-583, DOI: 10.1109/TIT.2005.862080.

Bennatan et al., "On the application of LDPC codes to arbitrary discrete-memoryless channels", IEEE Transactions on Information Theory, vol. 50, Issue 3, Mar. 2004, pp. 417-438, DOI: 10.1109/TIT.2004.824917.

Berrou et al., "Near Shannon limit error-correcting coding and decoding: Turbo-codes. 1", Proceedings of ICC '93—IEEE International Conference on Communications, May 23-26, 1993, OI: 10.1109/ICC.1993.397441.

Burnashev, "Data Transmission over a Discrete Channel with Feedback. Random Transmission Time", Problems of Information Transmission, vol. 12, No. 4, 1976, pp. 250-265.

Burshtein et al., "Asymptotic enumeration methods for analyzing LDPC codes", IEEE Transactions on Information Theory, vol. 50, Issue 6, Jun. 1, 2004, pp. 1115-1131, DOI: 10.1109/TIT.2004.828064.

Chen et al., "Lossless Source Coding in the Point-to-Point, Multiple Access, and Random Access Scenarios", 2019 IEEE International Symposium on Information Theory (ISIT), Jul. 2019, pp. 1692-1696, DOI: 10.1109/ISIT.2019.8849742.

Chen et al., "Lossless Source Coding in the Point-to-Point, Multiple Access, and Random Access Scenarios", IEEE Transactions on Information Theory, vol. 66, Issue 11, Nov. 1, 2020, pp. 6688 to 6722, DOI: 10.1109/TIT.2020.3005155.

Davey et al., "Low-Density Parity Check Codes over GF(q)", IEEE Communications Letters, vol. 2, No. 6, Jun. 1998, pp. 165-167.

Di et al., "Finite-length analysis of low-density parity-check codes on the binary erasure channel", IEEE Transactions on Information Theory, vol. 48, No. 6, Jun. 2002, pp. 1570-1579, DOI: 10.1109/TIT.2002.1003839.

Draper et al., "Efficient variable length channel coding for unknown DMCs", Proceedings of the International Symposium on Information Theory, Chicago, Illinois, Jun. 27-Jul. 2, 2004, p. 379.

Effros et al., "Random Access Channel Coding in the Finite Blocklength Regime", IEEE Transactions on Information Theory, Jun. 2018, arXiv:1801.09018 [cs.IT] Jan. 27, 2018, 9 pgs., DOI:10.1109/TIT.2020.3047630.

Elias, "Coding for Noisy Channels", in IRE Conv. Rec., vol. 3, Mar. 1955, pp. 37-46.

Erez et al., "The ML decoding performance of LDPC ensembles over Z/subq/", IEEE Transactions on Information Theory, vol. 51, Issue 5, May 2005, pp. 1871-1879, DOI: 10.1109/TIT.2005.846431.

Gallager, "Information Theory and Reliable Communication", Courses and Lectures, No. 30, 1st Edition, Springer, vol. 2, Jul. 1970, 116 pgs.

Gallager, "Low-density parity-check codes", IRE Transactions on Information Theory, vol. 8, Issue 1, Jan. 1962, pp. 21-28, DOI: 10.1109/TIT.1962.1057683.

Hajek et al., "Decentralized dynamic control of a multiaccess broadcast channel", IEEE Transactions on Automatic Control, vol. 27, Issue 3, Jun. 1982, pp. 559-569, DOI: 10.1109/TAC.1982.1102978.

Han et al., "A new achievable rate region for the interference channel", IEEE Transactions on Information Theory, vol. IT-27, Issue 1, Jan. 1981, pp. 49-60, https://doi.org/10.1109/TIT.1981.1056307.

Huang et al., "Finite Blocklength Coding for Multiple Access Channels", Proceedings of the IEEE International Symposium on Information Theory Proceedings, Cambridge, Massachusetts, Jul. 1-6, 2012, 5 pgs.

Liu et al., "A new universal random coding bound for the multiple-access channel", Proceedings of 1995 IEEE International Symposium on Information Theory, Sep. 17-22, 1995, p. 442, DOI: 10.1109/ISIT.1995.550429.

Liu et al., "Finite-Blocklength and Error-Exponent Analyses for LDPC Codes in Point-to-Point and Multiple Access Communication", 2020 IEEE International Symposium on Information Theory (ISIT), Jun. 1-26, 2020, pp. 361-366, DOI: 10.1109/ISIT44484.2020.9173963.

Measson et al., "Maxwell Construction: The Hidden Bridge Between Iterative and Maximum a Posteriori Decoding", IEEE Transactions on Information Theory, vol. 54, Issue 12, Dec. 2008, first published Nov. 25, 2008, pp. 5277-5307, DOI: 10.1109/TIT.2008.2006466.

Mei et al., "Performance Analysis of Finite-Length LDPC Codes Over Asymmetric Memoryless Channels", IEEE Transactions on Vehicular Technology, vol. 68, Issue 11, Nov. 2019, first published Sep. 27, 2019, pp. 11338-11342, DOI: 10.1109/TVT.2019.2944139.

Miller et al., "Bounds on the maximum-likelihood decoding error probability of low-density parity-check codes", IEEE Transactions on Information Theory, vol. 47, Issue 7, Nov. 2001, pp. 2696-2710, DOI: 10.1109/18.959254.

Polyanskiy, "Information theoretic methods in statistics and computer science", [online] Available: http://people.lids.mit.edu/yp/homepage/data/LN_fdiv.pdv.

Polyanskiy et al., "Channel Coding Rate in the Finite Blocklength Regime", IEEE Transactions on Information Theory, vol. 56, No. 5, May 2010, pp. 2307-2359, DOI 10.1109/TIT.2010.2043769.

Polyanskiy et al., "Feedback in the Non-Asymptotic Regime", IEEE Transactions on Information Theory, vol. 57, No. 8, Aug. 2011, pp. 4903-4925.

Reznik, "An Algorithm for Quantization of Discrete Probability Distributions", in Proc. Data Compression Conference, 2011, pp. 333-342.

Richardson et al., "Finite-length analysis of various low-density parity-check ensembles for the binary erasure channel", Proceedings IEEE International Symposium on Information Theory, Jun. 30, 2002-Jul. 5, 2002, DOI: 10.1109/ISIT.2002.1023273.

Roberts, "ALOHA packet system with and without slots and capture", ACM SIGCOMM Computer Communication Review, vol. 5, No. 2, Apr. 1975, pp. 28-42.

Roumy et al., "Characterization and Optimization of LDPC Codes for the 2-User Gaussian Multiple Access Channel", EURASIP Journal on Wireless Communications and Networking, vol. 2007, Article 74894, Jun. 2007, 10 pgs., DOI: 10.1155/2007/74890.

Shabah et al., "Grant-free Non-orthogonal Multiple Access for IoT: A Survey", IEEE Communications Surveys & Tutorials, vol. 22, No. 3, Third Quarter 2020, pp. 1805-1838, DOI:10.1109/COMST.2020.2996032.

Sharifi et al., "LDPC Code Design for the Two-User Gaussian Multiple Access Channel", IEEE Transactions on Wireless Communications, vol. 15, Issue 4, Apr. 2016, first published Dec. 23, 2015, pp. 2833-2844, DOI: 10.1109/TWC.2015.2511749.

Shevtsova, "On the absolute constants in the Berry-Esseen-type inequalities", Doklady Mathematics, vol. 89, May 2014, pp. 378-381, https://doi.org/10.1134/S1064562414030338.

(56) References Cited

OTHER PUBLICATIONS

Tan et al., "On the Dispersions of Three Network Information Theory Problems", IEEE Transactions on Information Theory, vol. 60, No. 2, Feb. 2014, pp. 881-903, arXiv:1201.3901.

Tchamkerten et al., "A Feedback Strategy for Binary Symmetric Channels", Proceedings of the IEEE International Symposium on Information Theory, Lausanne, Switzerland, Jun. 30-Jul. 5, 2002, pp. 362.

Tehamkerten et al., "A feedback strategy for binary symmetric channels", Proceedings IEEE International Symposium on Information Theory, Jun. 30-Jul. 5, 2002, DOI: 10.1109/ISIT.2002. 1023634.

Tsitsiklis, "Analysis of a multiaccess control scheme", IEEE Transactions on Automatic Control, vol. AC-32, No. 11, Nov. 1, 1987, pp. 1017-1020, DOI:10.1109/TAC.1987.1104494.

Wu et al., "FASA: accelerated S-ALOHA using access history for event-driven M2M communications", IEEE/ACM Transactions on Networking, vol. 21, No. 6, Dec. 2013, pp. 1904-1917, DOI: 10.1109/TNET.2013.2241076.

Yagi et al., "Coset codes for compound multiple access channels with common information", 2009 IEEE International Symposium on Information Theory, ISIT 2009, Nov. 19, 2009, pp. 1854-1858, DOI:10.1109/ISIT.2009.5205439.

Yang et al., "New Nonasymptotic Channel Coding Theorems for Structured Codes", IEEE Transactions on Information Theory, vol. 61, No. 9, Sep. 2015, pp. 4534-4553, DOI: 10.1109/TIT.2015. 2449852.

Yavas et al., "Gaussian Multiple and Random Access in the Finite Blocklength Regime", 2020 IEEE International Symposium on Information Theory (ISIT), 2020, pp. 3013-3018, doi: 10.1109/ ISIT44484.2020.9174026.

Yazdani et al., "Waterfall Performance Analysis of Finite-Length LDPC Codes on Symmetric Channels", IEEE Transactions on Communications, vol. 57, Issue 11, Nov. 2009, pp. 3183-3187, DOI: 10.1109/TCOMM.2009.11.070210.

* cited by examiner

TABLE I
SUMMARY OF NOTATIONS

| | |
|---|---|
| $K$ | maximum number of active transmitters |
| $n_i$ | blocklength/number of LDPC variable nodes after stage $i, i \in [K]$ design |
| $r_i$ | number of LDPC check nodes after stage $i, i \in [K]$ design |
| $n_{\Delta i}$ | increment blocklength/number of LDPC variable nodes for stage $i, i \in [K]$ design |
| $r_{\Delta i}$ | increment number of LDPC check nodes for stage $i, i \in [K]$ design |
| $\lambda_i$ | variable node degree of stage $i, i \in [K]$ regular LDPC code |
| $\rho_i$ | check node degree of stage $i, i \in [K]$ regular LDPC code |
| $Q$ | $GF(q)$ |
| $\mathcal{G}$ | bipartite LDPC graph |
| $\mathcal{V}$ | vertex set of a graph $\mathcal{G}$ |
| $\mathcal{E}$ | edge set of a graph $\mathcal{G}$ |
| $i(x;y)$ | information density |
| $C$ | channel capacity |
| $V$ | channel dispersion |
| $T$ | third-order centered moment of information density |
| $Q$ | complementary Gaussian CDF |
| $\mathcal{T}_Q^n$ | set of all possible types for $n$ elements from $Q$ |
| $v$ | LDPC coset vector |
| $\delta$ | LDPC quantizer |
| $\overline{S}_{L,r}^n(t)$ | LDPC code ensemble-average number of type-$t$ codewords with $r$ check nodes |
| $\overline{S}^n$ | ensemble-average spectrum |
| $B(n,t)$ | multinomial coefficient |
| $E_p(R)$ | Gallager's error exponent for distribution $p$ |

FIG. 4

SYSTEMS AND METHODS FOR COMMUNICATING USING NESTED LOW DENSITY PARITY CHECK CODES

CROSS-REFERENCE TO RELATED APPLICATIONS

The present invention claims priority to U.S. Provisional Patent Application Ser. No. 62/959,678 entitled "Finite-Blocklength and Error Exponent Analyses for LDPC Codes in Point-to-Point and Multiple Access Communication" to Michelle Effros and Yuxin Liu, filed Jan. 10, 2020, the disclosures of which is herein incorporated by reference in its entirety.

STATEMENT OF FEDERALLY SPONSORED RESEARCH

This invention was made with government support under Grant No. CCF1817241 awarded by the National Science Foundation. The government has certain rights in the invention.

FIELD OF THE INVENTION

The present invention generally relates to communication systems and more specifically to communication systems that enable transmission by one or more transmitters using nested Low Density Parity Check codes.

BACKGROUND

Random access techniques have a pivotal role in modern communication systems, as the set of transmitters may be unknown or time-varying in many applications like Internet of Things (IoT) and sensor networks. In addition, network information theory, which aims to establish the fundamental limits of information flow and corresponding coding schemes in networks, has been attracting increasing interest in the past decades. However, the majority of network information theory studies assume the set of transmitters is fixed and known.

Most widely adopted random access techniques focus on collision avoidance or orthogonalization, which facilitate many users to share the network medium without interference. Slotted-ALOHA (S-ALOHA) introduces discrete time slots to coordinate the start of transmission. A transmission is acknowledged to be successful if only one transmitter is active for that slot; otherwise a collision is declared. Packets that collide are transmitted again after a random delay to avoid repeated collision. Under a set of assumptions, S-ALOHA is shown to achieve 36.8% of the single-transmitter capacity. Past improvements on S-ALOHA include adaptive S-ALOHA, which addresses the instability issue of S-ALOHA, and fast adaptive S-ALOHA, which seeks to accelerate the algorithm and decrease the access delay. Orthogonalization methods partition available resources, such as time and frequency, and allocate a fixed fraction to each user. Typical orthogonalization protocols include time-division multiple access (TDMA), frequency-division multiple access (FDMA), and code-division multiple access (CDMA). The cost associated with simplifying coding using orthogonalization protocols is significant, as the best sum-rate (throughput) achievable is equal to the single-transmitter capacity of the channel, which could be considerably smaller than the maximum multi-transmitter sum-rate of the channel.

SUMMARY OF THE INVENTION

Systems and methods in accordance with various embodiments of the invention enable communicating using nested Low Density Parity Check (LDPC) codes. A nested LDPC code is an LDPC code having a full blocklength, where shorter blocklengths of the nested LDPC code can be utilized as shorter blocklength LDPC codes. In effect, the shorter blocklength LDPC codes are nested within the LPDC code having the full blocklength.

In certain embodiments, a transmitter utilizes a nested LDPC code to communicate via a point-to-point connection. In various embodiments, the nested LDPC code acts as a rateless code and the transmitter transmits until a feedback message is provided by a receiver indicating that the transmitted message has been decoded. In several embodiments, multiple transmitters utilize nested LDPC codes to communicate simultaneously via a Random Access Channel (RACs), where none of the transmitters nor the receiver know which and how many transmitters are active. In several embodiments, the transmitters can utilize the same nested LDPC code. In a number of embodiments, different transmitters can utilize different nested LDPC codes.

One embodiment of the communication system includes at least one transmitter, where each transmitter comprises an encoder configured to: receive a start of epoch message; encode message data as symbols using a rateless code determined using a nested Low Density Parity Check (LDPC) code by mapping a codeword to a symbol; and receive feedback messages at a predetermined set of potential decoding times. In addition, the transmitter is configured to transmit symbols until a received feedback message is an end of epoch message. The communication system also includes a receiver comprising a decoder, where the decoder is configured to: cause a broadcast transmitter to transmit at least one start of epoch message; receive observed symbols; at each of a predetermined set of decode times, determine whether a decoding rule is satisfied; and when the decoding rule is satisfied decode at least one message based upon the received observed symbols based upon the nested LDPC code, and cause the broadcast transmitter to transmit an end of epoch message.

In a further embodiment, the nested LDPC code is an LDPC code having a full blocklength that corresponds to a longest decode time from the set of predetermined decode times; the nested LDPC code is further characterized in that at least one shorter blocklength of the LDPC code having the full blocklength forms at least one shorter blocklength LDPC code; and each of the at least one shorter blocklength LDPC codes corresponds to a decode time from the set of predetermined decode times that is shorter than the longest decode time from the set of predetermined decode times.

In another embodiment, the at least one shorter blocklength LDPC code comprises a first shorter blocklength LDPC code and a second shorter blocklength LDPC code. The first shorter blocklength LDPC code includes a first set of variable nodes, and a first set of check nodes. The second shorter blocklength LDPC code includes: a second set of variable nodes including the first set of variable nodes and an incremental set of variable nodes; and a second set of check nodes including the first set of check nodes and an incremental set of check nodes.

In a still further embodiment, the first set of check nodes are connected to one or more variable nodes from the first set of variable nodes, and the incremental set of check nodes are connected to one or more variable nodes from the second set of variable nodes.

In still another embodiment, the ratio of the first set of variable nodes to the first set of check nodes is different to the ratio of the second set of variable nodes to the second set of check nodes.

In a yet further embodiment, the determination of whether a decoding rule is satisfied is based upon the received observed symbols.

In yet another embodiment, the at least one transmitter is configured to select a specific nested LDPC code based upon the start of epoch message.

In a further embodiment again, multiple transmitters in the plurality of transmitters are configured to select the same nested LDPC code to use in the encoding of message data as symbols using a rateless code.

In another embodiment again, at least two of the plurality of transmitters are configured to select different nested LDPC codes to use in the encoding of message data as symbols using a rateless code.

In a further additional embodiment, at least two of the different nested LDPC codes have different code rates.

A transmitter in accordance with another additional embodiment includes: a receiver configured to receive a start of epoch message; an encoder configured to encode message data as symbols using a rateless code determined using a nested Low Density Parity Check (LDPC) code by mapping a codeword to a symbol; and a modulator configured to transmit symbols encoded by the encoder. In addition, the receiver is further configured to receive an end of epoch message at one of a predetermined set of times, and the modulator is configured to transmit symbols encoded by the encoder until an end of epoch message is received by the receiver.

In a still yet further embodiment, the nested LDPC code is an LDPC code having a full blocklength that corresponds to a longest decode time from the set of predetermined decode times; the nested LDPC code is further characterized in that at least one shorter blocklength of the LDPC code having the full blocklength forms at least one shorter blocklength LDPC code; and each of the at least one shorter blocklength LDPC code corresponds to a decode time from the set of predetermined decode times that is shorter than the longest decode time from the set of predetermined decode times.

In still yet another embodiment, the at least one shorter blocklength LDPC code comprises a first shorter blocklength LDPC code and a second shorter blocklength LDPC code. The first shorter blocklength LDPC code includes a first set of variable nodes, and a first set of check nodes. The second shorter blocklength LDPC code includes: a second set of variable nodes including the first set of variable nodes and an incremental set of variable nodes; and a second set of check nodes including the first set of check nodes and an incremental set of check nodes.

In a still further embodiment again, the first set of check nodes are connected to one or more variable nodes from the first set of variable nodes, and the incremental set of check nodes are connected to one or more variable nodes from the second set of variable nodes.

In still another embodiment again, the ratio of the first set of variable nodes to the first set of check nodes is different to the ratio of the second set of variable nodes to the second set of check nodes.

A receiver in accordance with a still further additional embodiment includes: a transmitter configured to transmit at least one start of epoch message, and a receiver configured to receive observed symbols. In addition, the decoder is further configured to: determine whether a decoding rule is satisfied at each of a predetermined set of decode times; and when the decoding rule is satisfied, decode at least one message based upon the received observed symbols based upon a rateless code determined using a nested LDPC code, and cause the transmitter to transmit an end of epoch message.

In still another additional embodiment, the nested LDPC code is an LDPC code having a full blocklength that corresponds to a longest decode time from the set of predetermined decode times; the nested LDPC code is further characterized in that at least one shorter blocklength of the LDPC code having the full blocklength forms at least one shorter blocklength LDPC code; and each of the at least one shorter blocklength LDPC code corresponds to a decode time from the set of predetermined decode times that is shorter than the longest decode time from the set of predetermined decode times.

In a yet further embodiment again, the at least one shorter blocklength LDPC code comprises a first shorter blocklength LDPC code and a second shorter blocklength LDPC code. The first shorter blocklength LDPC code comprises a first set of variable nodes, and a first set of check nodes. The second shorter blocklength LDPC code includes: a second set of variable nodes including the first set of variable nodes and an incremental set of variable nodes; and a second set of check nodes including the first set of check nodes, and an incremental set of check nodes.

In yet another embodiment again, the first set of check nodes are connected to one or more variable nodes from the first set of variable nodes; and the incremental set of check nodes are connected to one or more variable nodes from the second set of variable nodes.

In a yet further additional embodiment, the ratio of the first set of variable nodes to the first set of check nodes is different to the ratio of the second set of variable nodes to the second set of check nodes.

In yet another additional embodiment, the decoder is selected from the group consisting of a maximum likelihood decoder and a belief propagation decoder.

BRIEF DESCRIPTION OF THE DRAWINGS

FIG. 4 includes a table (Table 1) of notation utilized to describe systems and methods in accordance with various embodiments of the invention.

DETAILED DESCRIPTION

Figure 1:
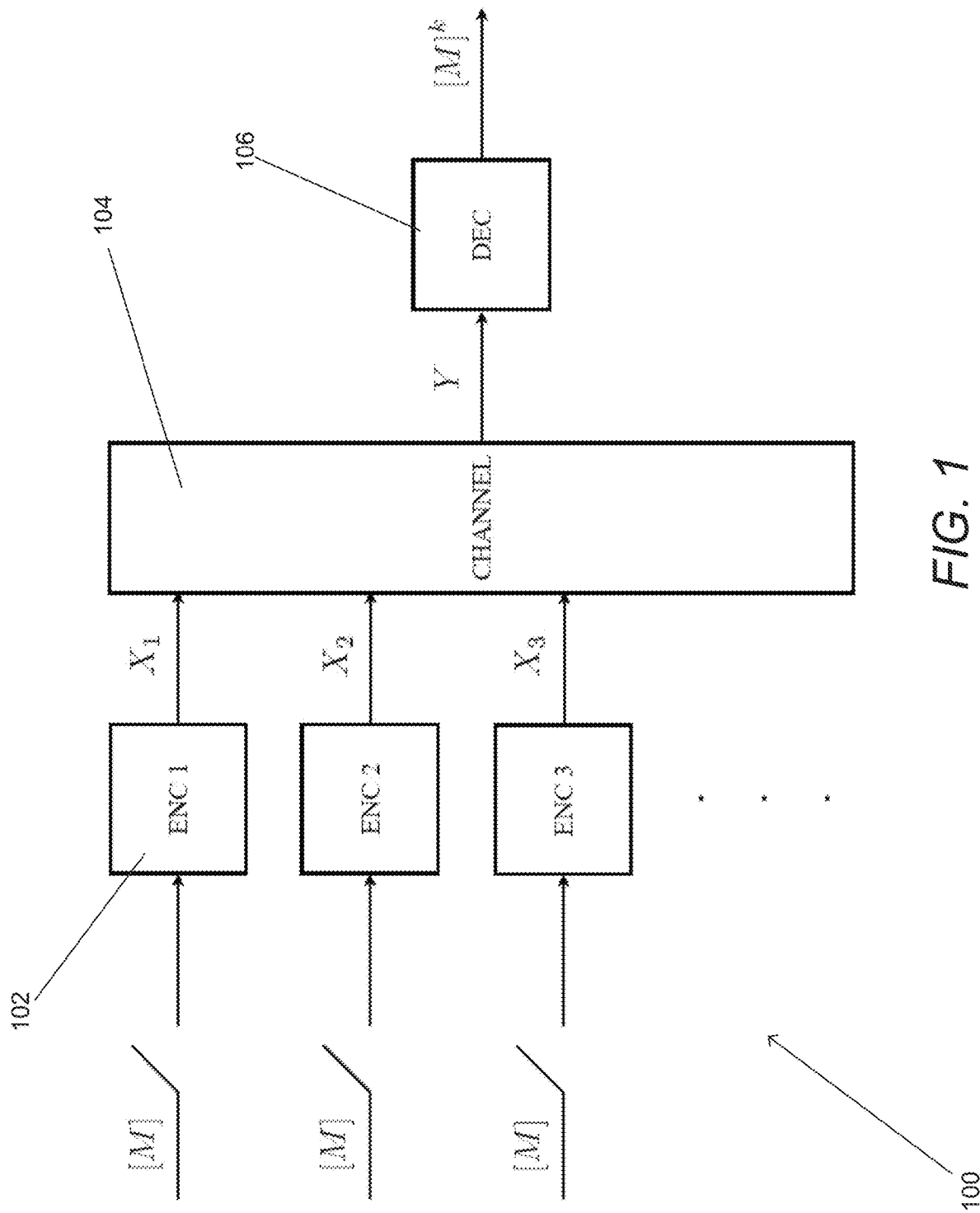
FIG. 1 conceptually illustrates a receiver configured to control transmission by transmitters on a Random Access Channel (RAC) during epochs defined by the receiver in accordance with an embodiment of the invention.

Turning now to the drawings, systems and methods for communicating using nested Low Density Parity Check (LDPC) codes in accordance with various embodiments of the invention are illustrated. A nested LDPC code is an LDPC code having a full blocklength, where shorter blocklengths of the nested LDPC code can be utilized as shorter blocklength LDPC codes. In effect, the shorter blocklength LDPC codes are nested within the LPDC code having the full blocklength. In many embodiments, the shorter blocklength LDPC codes have higher rates than the rate of the LDPC code having the full blocklength. As a result, nested LDPC codes can be utilized as rateless codes and/or in systems that support adaptive coding and modulation. In many embodiments, a nested LDPC code can be defined programmatically. Accordingly, codewords of increasingly larger blocklength can be generated by the transmitter(s) and receiver as required to enable decoding of one or more transmitted messages at a decode time that can also be programmatically determined with each increase in the full blocklength of the nested LDPC code.

Nested LDPC codes can be contrasted with the technique of puncturing a low rate LDPC code to achieve higher code rates. Puncturing typically relies upon a single blocklength LDPC code and only transmitting certain symbols corresponding to a fraction of the codeword symbols of the LDPC code to achieve a higher code rate. Puncturing essentially treats the non-transmitted symbols as erasures and relies upon the low rate LDPC code that was punctured to recover the user data. By contrast, each shorter blocklength LDPC code nested within a nested LDPC code represents a distinct LDPC code that is utilized by a decoder to recover the transmitted user data. When a nested LDPC code is utilized, the decoder does not decode the user data utilizing a lower rate LDPC code having a longer blocklength than the blocklength of the transmitted symbols.

In certain embodiments, a transmitter utilizes a nested LDPC code to communicate via a point-to-point connection. In various embodiments, the nested LDPC code acts as a rateless code and the transmitter transmits until a feedback message is provided by a receiver indicating that the transmitted message has been decoded. In a number of embodiments, the nested LDPC code is utilized to achieve adaptive coding and modulation. The transmitter can transmit an agreed upon blocklength of the nested LDPC code (potentially encoding user data using a shorter blocklength LDPC code nested within the nested LDPC code) to achieve a desired code rate.

In several embodiments, multiple transmitters utilize nested LDPC codes to communicate via Discrete Memoryless Random Access Channels (DM-RACs). In a number of embodiments, the DM-RAC is considered as a family of discrete memoryless multiple access channels (DM-MACs) depending on the transmitter activities. However, none of the transmitters nor the receiver know which and how many transmitters are active. In several embodiments, the transmitters can utilize the same nested LDPC code. In a number of embodiments, different transmitters can utilize different nested LDPC codes. A benefit of using different nested LDPC codes is that a receiver can utilize knowledge of the different nested LDPC codes utilized by different transmitters to determine which transmitter transmitted a specific message.

In a number of embodiments, a transmitter can select between different nested LDPC codes having different code rates. In the context of a nested LDPC code, a different code rate can be determined for each shorter blocklength LDPC code nested within the nested LDPC code. The code rate need not be the same for all shorter blocklength LDPC codes nested within a particular nested LDPC code. For example, the LDPC code having the full blocklength can be rate 1/2 and a shorter blocklength LDPC code nested within the LDPC code having the full blocklength can have a code rate greater than 1/2 (e.g., 3/5). By selecting between nested LDPC codes having different code rates at a given blocklength, a transmitter can determine its code rate during a particular epoch. In the context of transmitters communicating via a RAC, transmitters can balance and/or prioritize utilization of the RAC through their choice of code rate. In many embodiments, a transmitter (such as a transmitter utilizing a RAC) can select between different LDPC codes to adjust code rate from one time epoch to the next.

Systems and methods in accordance with many embodiments of the invention utilize nested LDPC codes designed using K≥1 stages, where the codewords for each blocklength $n_i$, i∈[K] are nested in the codewords for each blocklength distinct $n_j$, j∈[K], provided that. $n_j \geq n_i$. As discussed above, nested LDPC codes can be utilized as rateless codes. Rateless codes are codes that enable various decoding times. Traditionally, one or more transmitters in a rateless code listen for feedback (often a single bit) from the receiver that indicates whether to continue or stop their transmissions at every time step. Feedback can dramatically improve the maximum achievable rate in the finite-blocklength regime. Instead of allowing arbitrary decoding times and thus requiring feedback at every time step, a limited set of decoding times can be employed. In a number of embodiments, the transmissions happen in epochs and the set of decoding times $\{n_1, n_2, \ldots, n_K\}$ is finite and predetermined, where $n_k$, k∈{1, . . . , K} refers to the decoding time. The decoding times can be determined based upon factors including (but not limited to) different channel conditions and/or different code rates. In the context of communication via a RAC, the decoding times can correspond to different times at which a decoder believes there are k active transmitters and it is able to decode. In a number of embodiments, a decoder receiving transmitted symbols via a RAC first estimates the number of active transmitters and then performs ML decoding at some pre-determined time $n_k$ if the decoder believes the number of active transmitters is k. In addition, the decoder examines the channel output at $n_0$ to detect whether any transmitter is active in the current epoch. This is particularly useful as $n_0$ can be chosen to be very small compared to other decoding times $n_k$, k∈[K], allowing a new epoch to begin quickly. In some embodiments, $n_k$ refers to the decoding time when a particular $\mathcal{A}_k \subseteq \{1, \ldots, K\}$ of transmitters is active. In other embodiments, $n_k$ refers to the stopping time when any of some collection of transmitter subsets ($\mathcal{B}_k = (\mathcal{B}_{k,1}, \ldots, \mathcal{B}_{k,f(k)})$) is active, here f(k) is the number of subsets in $\mathcal{B}_k$. In many embodiments, the stopping times are ordered so that $n_1 \leq n_2 \leq \ldots \leq n_k$.

In several embodiments, a communication system capable of communicating via a RAC can achieve additional efficiency gains by detecting early within a time epoch that an unusually large number of transmitters have commenced simultaneously transmitting. Instead of requiring all transmitters to continue to transmit with a long blocklength, the receiver can transmit a feedback message ending the epoch and indicating to one or more of the transmitters that they should wait a period of time before attempting to retransmit.

In several embodiments, the period of time that a transmitter waits before attempting to retry transmitting its message can be a number of time epochs specified by the transmitter. In certain embodiments, the period of time can be a random number of time epochs determined by the transmitter. In a number of embodiments, a receiver can terminate an epoch without decoding transmitted messages by utilizing an LDPC code in which $n_k$ is comparatively small for some large value number of transmitters, allowing a decoder to abort transmission and declare an outage rather than suffer a long period of low per-user transmission rates when the number of active transmitters is unusually high.

While i.i.d. random rateless codes enjoy the property of independence between symbols within and across codewords, making them theoretically simple to analyze, the mutual independence also induces difficulties in practical implementations. In contrast, linear codes, such as LDPC codes, are more structured and thus more realistic to implement. LDPC codes are equipped with sparse parity-check matrices for the purpose of enabling low complexity decoding strategies. LDPC codes are now in widespread use, playing a role in commercial standards like 10 Gb/s Ethernet (IEEE 803.3an), WiFi (IEEE 802.11n), WiMAX (IEEE 802.16e), and the 5G standard. However, LDPC codes are typically not amendable to construction through the processes of concatinating sub-codewords that enable construction of nested random rateless codes. Accordingly, new processes were developed for the construction of the various nested LDPC codes described herein in order to enable their utilization within communication systems including (but not limited to) point-to-point and DM-RAC communication systems. Furthermore, the use of nested LDPC codes (or similar LDPC codes) as described herein should be understood as in no way limited to memoryless channel or symmetrical channels, but can be utilized in any of a variety of different communication applications including any of a variety of different communication channels.

Finite-blocklength achievability bounds can be developed, using both error-exponent analysis and dispersion-style analysis, for LDPC codes for the RAC, in which neither the encoders nor the decoder know in advance which or even how many of the total K transmitters are active. As noted above, the nested LDPC codes utilized in accordance with various embodiments of the invention can be designed in K stages, corresponding to each of the K potential decoding times $n_k$, $k \in [K]$. The achievability bounds indicate that the nested LDPC codes described herein are not only capacity-achieving (first-order optimal), but also achieve second-order performance that is comparable to the best-prior results for the corresponding MAC.

For the dispersion-style approach, a third-order achievability result can be derived for the proposed nested LDPC codes. The result demonstrates that the performance of the proposed nested LDPC codes achieve the first-order optimal performance (capacity) and match the second-order (dispersion) performance of the best-performing codes used in the Multiple Access Channel (MAC), where the set of active transmitters is known to all users and no feedback is employed.

Systems and methods that communicate using nested LDPC codes in accordance with various embodiments of the invention are discussed further below.

Systems and Methods for Communicating Using Nested LDPC Codes

Communication systems in accordance with various embodiments of the invention can impose restrictions on an active transmitter. Specifically, the receiver can use feedback messages to define epochs. During each epoch, a transmitter can decide whether or not it wishes to be active. In some embodiments, an active transmitter transmits symbols for the duration of the epoch, where each symbol is generated based upon a set of message data bits using a nested LPDC code. A receiver configured to control the transmission of at least one transmitter during epochs defined by the receiver in accordance with an embodiment of the invention is conceptually illustrated in FIG. 1.

The communication system 100 includes at least one transmitter, and each transmitter includes an encoder 102. Each transmitter that has message data to transmit can choose to become active during any given epoch. Where only one transmitter is present, the communication system is a point-to-point communication system. When multiple transmitters are present, the communication system can act as a RAC communication system in which multiple transmitters can simultaneously transmit on a shared communication channel. When a transmitter is active, the transmitter can provide a sequence of message bits to a rateless encoder 102, which generates a sequence of output symbols based upon a nested LDPC code; output symbols are then transmitted over a channel 104. When multiple transmitters are active, the active transmitters simultaneously transmit over the RAC channel 104 to a receiver. As discussed above, the use of nested LDPC codes as rateless codes enables the receiver to continue to receive symbols (i.e., extend the duration of a particular epoch) until the receiver's decoder 106 has observed enough symbols to decode the transmitted messages with high probability or to trigger any other stopping rule. In many embodiments, the decoder employs a decoding rule that is applied at a predetermined set of potential decoding times. In several embodiments, each potential decoding time in the set of potential decoding times corresponds to a number of symbols determined to be required for the decoder to be able to decode messages from a specific number of transmitters. In certain embodiments, application of the decoding rule essentially involves attempting to decode a number of messages at each potential decoding time, which indirectly provides an estimate of the number of transmitters that are active during an epoch. Based upon the decoding rule, the decoder tries decoding at each subsequent decoding time in the set of potential decoding times. It chooses the first decoding time from that set for which it finds a collection of messages consistent with its received symbols and with the activity set or sets corresponding to that decoding time. As noted above, the receiver can also utilize a criterion to detect that an unusually large number of transmitters are transmitting. In which case, the receiver can send a feedback message ending the epoch and directing that transmitters to wait a period of time (e.g., a random number of epochs) before attempting to retry transmitting a message.

As noted above, the receiver need not continuously transmit its decoding state to the transmitters. In a number of embodiments, the transmitters and the receiver establish a set of potential decoding times and the receiver sends a positive or negative feedback message at each potential decoding time indicating whether the receiver requires more symbols to be able to decode the messages with a high probability (here called a negative feedback message) or whether the receiver has received enough symbols and has decided to decode the messages and start a new epoch (i.e., a positive feedback message).

In many embodiments, the set of potential decoding times is determined based upon channel conditions. As the channel deteriorates, the receiver can adapt and choose a set of potential decoding times where the number of symbols required to be received during an epoch for a given estimated number of transmitters increases. When the channel improves the receiver can adapt to a set of potential decoding times in which the number of symbols required to be received for a given estimated number of transmitters decreases. In a number of embodiments, the receiver adapts the set of potential decoding times utilized during a particular epoch based upon a measurement of channel conditions including (but not limited to) fading and channel noise. In several embodiments, the receiver periodically signals a guard interval in which transmitters are required to cease activity. During this guard interval, the receiver can measure channel noise and determine an appropriate set of potential decoding times. In some embodiments, the receiver periodically signals a test interval in which active transmitters are required to send pilot signals. During these test intervals, the receiver can estimate fading conditions and determine an appropriate set of potential decoding times. The receiver can then broadcast the set of potential decoding times and/or an identifier of the set of potential decoding times to the transmitters and can initiate the next epoch via a transmission of a positive feedback message. The transmitters can then monitor the feedback channel for positive and negative feedback messages based upon the set of potential decoding times communicated by the receiver. In a number of embodiments, instead of and/or in addition to utilizing alternative decoding times in response to changes in channel conditions, transmitters can also select between different nested LDPC codes having different code rates at a given decoding time. Although specific methods are described for adapting between different sets of potential decoding times, it can readily be appreciated that any of a variety of techniques can be utilized for determining an appropriate set of decode times for a given set of channel conditions and coordinating the adoption of such a set of decode times by the receiver and transmitters in accordance with various embodiments of the invention.

While many advantages can be obtained through the use of nested LDPC codes in accordance with embodiments of the invention, communication systems in accordance with a number of embodiments of the invention communicate via a RAC using punctured LDPC codes. When punctured LDPC codes are utilized, a single blocklength LDPC code can be utilized by each transmitter in which codeword symbols are transmitted until a decoder is capable of decoding the one or more simultaneously transmitted messages. The decoding process can assume that all transmitted messages have the blocklength of the LDPC code(s) and the codeword symbols that have not yet been transmitted (i.e., the punctures) can simply be treated as erasures. Accordingly, utilizing a punctured LDPC code does not result in a reduction in the computational complexity required to decode the transmitted symbols. By contrast, the decoding process of a nested LDPC code can take advantage of the fact that each shorter blocklength code nested within the LDPC code of full blocklength has a reduced number of check nodes. While much of the discussion that follows focuses on the use of nested LDPC codes, because of the benefits that nested LDPC codes have in many applications, it should be appreciated that punctured LDPC codes and/or other varieties of LDPC codes can be utilized in communication systems in which the blocklengths of individual messages are unknown prior to commencement of transmission as appropriate to the requirements of specific applications in accordance with various embodiments of the invention.

In a number of embodiments, multiple transmitters use the same encoder 102 and the receiver broadcasts an indication of a particular nested LDPC code to use in a given epoch. In several embodiments, multiple transmitters are able to use different nested LDPC codes. Using different nested LDPC codes can enable the decoder to identify the transmitter that transmitted a specific message decoded by the decoder 106. Using different nested LDPC codes can also enable the encoders to transmit different numbers of messages and attain different rates. When transmitters encode using different encoders, the receiver can transmit information indicating the specific nested LDPC code to be used by a particular encoder at the start of a particular epoch. The receiver can then utilize knowledge of the different nested LDPC codes that were potentially utilized in the decoding of the transmitted messages from the observed symbols.

Although specific communication systems are described above with reference to FIG. 1, any of a variety of transmitters and receivers that employ LDPC codes to transmit data over a channels including (but not limited to) the RAC channel can be utilized as appropriate to the requirements of a given application in accordance with various embodiments of the invention. Indeed, communication systems in accordance with various embodiments of the invention are in no way limited to any particular communication medium, spectral band, and/or modulation or demodulation scheme. Symbols encoded in accordance with various embodiments of the invention can be transmitted using any number of different modulation schemes appropriate to the requirements of a given application and/or can employ additional outer codes to correct bit errors in the messages decoded by the receiver. The transmitters and receivers described herein should be understood as being capable of being deployed in any communication system in which an unknown number of transmitters utilize nested LDPC codes and/or a shared channel to communicate with a receiver. A number of specific encoding and decoding processes in accordance with different embodiments of the invention are discussed below.

Processes for Encoding Data

Transmitters in accordance with various embodiments of the invention are configured to wait to transmit data until the start of an epoch and then transmit data throughout the epoch. In many embodiments, the end of the epoch can be agreed upon from one epoch to the next by the transmitter and a receiver. In several embodiments, the transmitter determines the end of the epoch by listening periodically for a positive feedback message that indicates the end of the epoch. As discussed above, the codebook selected for the rateless code can be coordinated with the receiver. Therefore, in many embodiments the transmitter also monitors a feedback channel for a transmission from a receiver containing a codebook and/or an identifier for a codebook to be utilized within a specified (e.g., the next) epoch.

Figure 2:
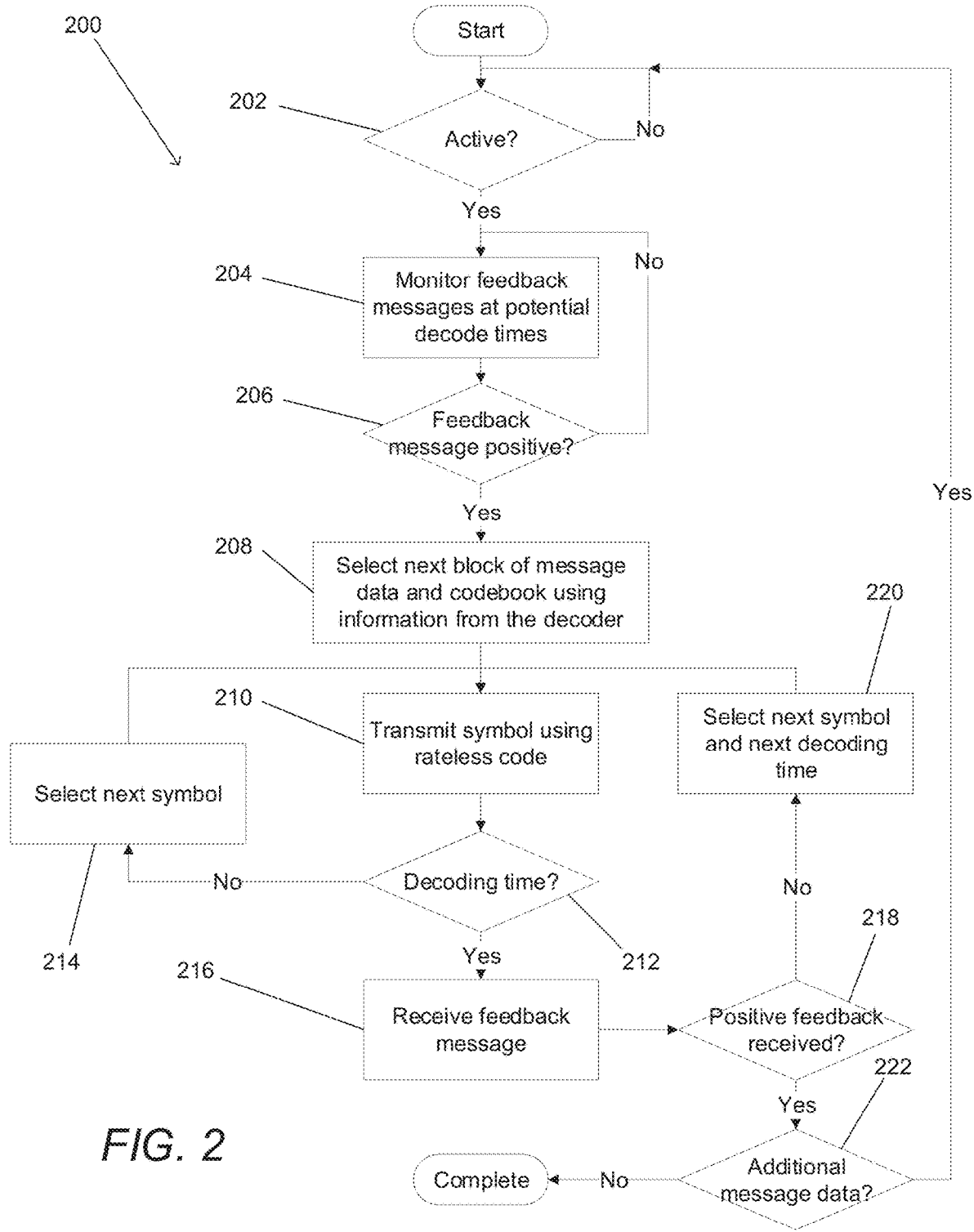
FIG. 2 is a flow chart illustrating a process for transmitting data using a rateless code on a RAC during epochs defined by a receiver in accordance with an embodiment of the invention.

A process for transmitting data using a nested LDPC code on a RAC during epochs defined by a receiver in accordance with an embodiment of the invention is illustrated in FIG. 2. The process 200 involves the transmitter determining 202 whether or not to become active during the next epoch. When the transmitter wishes to transmit, the transmitter commences monitoring 204 a feedback channel to determine 206 whether the receiver has broadcast a positive feedback message indicating the start time of the next epoch. As noted above, in many embodiments of the invention the receiver is limited to only transmitting feedback messages at a set of times (e.g., the set of potential decoding times) that are known to the transmitter. Accordingly, the transmitter may only monitor the feedback channel at those specific set of times until a positive feedback message is received.

The transmitter selects 208 a block of message data to transmit and a codebook to use to encode the message data using a rateless code. In many embodiments, encoders are employed within transmitters to encode the data using nested LDPC codes. As noted above, other embodiments may rely on other variations of LDPC codes. In many embodiments, the codebook utilized is a codebook indicated by a receiver and constitutes a common randomness between the transmitter and the receiver. In other embodiments, there is only one codebook, and that same codebook is always used to encode the message data using a rateless code. In certain embodiments, the codebook is the same for every transmitter. In many embodiments, the codebook is specific to the transmitter. In several embodiments, the transmitter can choose between a predetermined set of nested LDPC codes and the receiver determines the specific nested LDPC codes utilized by the transmitter(s) as part of the decoding process.

In order to encode the message data, the transmitter also resets a clock n that is used to count the number of transmitted symbols and a counter t that is used to index into the set of potential decoding times. As noted above, in some embodiments, the counter t can be considered to correspond to a number of active transmitters. In many embodiments, counter t can correspond to factors including (but not limited to) different channel conditions. When a receiver determines that t equals the estimated number of active transmitters and n equals the time $n_t$ for decoding when t transmitters are active, the receiver will transmit a positive feedback message indicating the end of the epoch. In other embodiments, the counter t can be considered an index identifying a specific subset of distinct encoders. When a receiver determines that t specifies the estimated set of active transmitters and n equals the time $n_t$ for decoding when subset t of the transmitters is active, the receiver will transmit a positive feedback message indicating the end of the epoch.

The transmitter transmits 210 the symbols generated by the rateless code based upon the block of message bits and with each transmitted symbols checks 212 to see whether the number of transmitted symbols corresponds to one of the potential decoding times in the set of potential decoding times. If not, then the transmitter increments 214 the clock n=n+1. When the number of transmitted symbols corresponds to a potential decoding time ($n_t$) from the set of potential decoding times, the transmitter listens 216 for a feedback message from the receiver. When a determination 218 is made that the feedback message is a negative feedback message, then the transmitter increments the clock n=n+1 and the counter t=t+1. The transmitter continues to transmit symbols generated by the rateless code (e.g., the nested LDPC code) until a determination 218 is made that a positive feedback message is received. At that point, the epoch is over and the transmitter determines 222 whether additional message data is available for transmission and whether 202 the transmitter wishes to be active during the next epoch. When no more message data is available for transmission, the process can complete. The process may begin again in the future if more messages become available for transmission.

Although specific processes for transmitting data are described above with reference to FIG. 2, any of a variety of processes can be utilized to transmit data as appropriate to the requirements of specific applications in accordance with various embodiments of the invention. While various embodiments of the invention are not limited to transmission via a RAC and can include transmission via point-to-point channels, communication via the RAC is a particularly interesting application having the potential to significantly expand the capabilities of conventional communication systems by allowing receivers to receive data from an unknown number of transmitters that are simultaneously transmitting on the same communication channel. Accordingly, processes for receiving and decoding data transmitted by an unknown number of transmitters via a RAC in accordance with a number of embodiments of the invention are discussed further below.

Processes for Decoding Data Transmitted by an Unknown Number of Transmitters Via a RAC Receivers in accordance with various embodiments of the invention are configured to receive data transmitted by an unknown number of transmitters on the same channel at the same time and encoded by rateless codes implemented using LDPC codes such as (but not limited to) nested LDPC codes. In some embodiments, these rateless codes are based upon a common codebook shared by one or more transmitters and the receiver. In other embodiments, these rateless codes are fixed. In order to be effective, the receiver can permit at least one transmitter to transmit symbols for a period of time that is sufficiently long to enable decoding of the transmitted message(s) with high probability. However, permitting the at least one transmitter to transmit more symbols beyond this required blocklength decreases the rate of the transmitters below capacity of the channel. Accordingly, receivers in accordance with many embodiments of the invention employ decoding rules to determine when a sufficient number of symbols are received to decode the transmitted message(s) with high probability. In a number of embodiments, a separate potential decoding time is determined for each possible number of active transmitters, and the receiver applies a decoding rule at each of the potential decoding times to determine whether the transmitted messages can be decoded. In this way, the decoding rule effectively constitutes an attempt to estimate the number of active transmitters. In several embodiments, the decoding times can also correspond to different channel conditions. Therefore, the decoding rule can constitute an attempt to estimate one or more of a variety of characteristics of the communication system including (but not limited to) the number of active transmitters and/or the characteristics of the communication channel.

The implementation of receivers in accordance with various embodiments of the invention can be influenced by the manner in which the receiver manages the case in which no transmitters are transmitting. The sooner the receiver ends an epoch in which no transmitters are transmitting, the higher the rate achieved across the channel. In a number of embodiments, receivers employ a separate process to determine whether transmitters are active and the receiver simply commences decoding when the receiver knows that transmitters are active. In other embodiments, the receiver incorporates a decoding rule that determines whether any transmitters are active prior to the first potential decoding time period.

Figure 3:
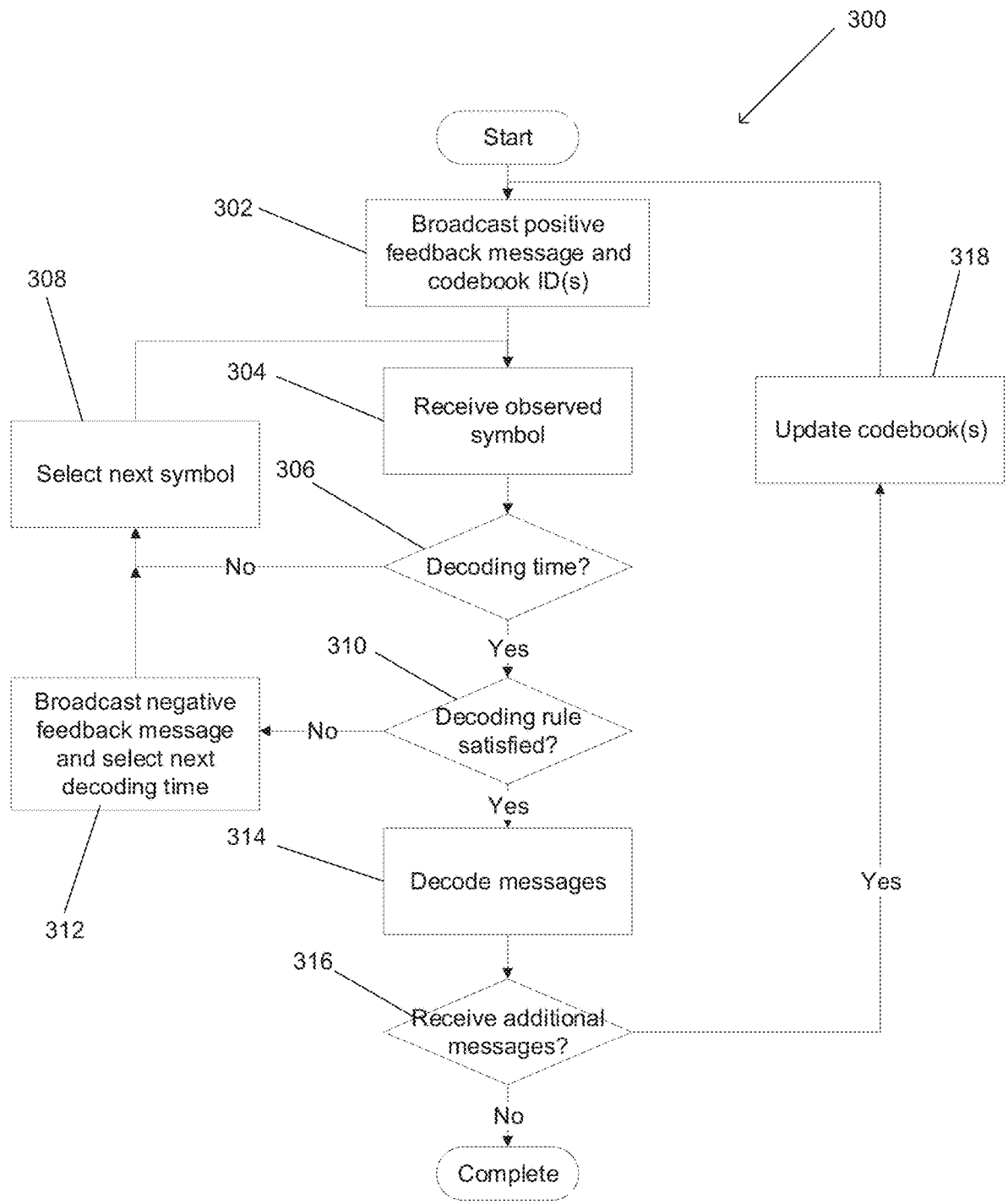
FIG. 3 is a flow chart illustrating a process for detecting whether one or more transmitters are active and/or decoding data transmitted by the one or more active transmitters via a RAC in accordance with an embodiment of the invention.

A process for detecting whether one or more transmitters are active and/or decoding data transmitted by the one or more active transmitters via a RAC in accordance with an embodiment of the invention is illustrated in FIG. 3. The process 300 commences when the receiver broadcasts 302 a positive feedback message to the transmitters indicating the commencement of an epoch. The positive feedback message can be accompanied by a message indicating one or more codebooks that should be utilized by one, some, or all of the transmitters to encode message data using rateless codes during the epoch.

As part of a process of receiving and decoding symbols, the receiver initializes a clock n that is used to count the number of received symbols and a counter t that is used to index into the set of potential decoding times ($n_t$). As noted above, in some embodiments, the counter t can be considered to correspond to a number of active transmitters. When a receiver determines that t equals the estimated number of active transmitters and $n=n_t$, the receiver will transmit a positive feedback message indicating the end of the epoch. In other embodiments, the counter t can be considered an index identifying a specific subset of distinct encoders. When a receiver determines that t specifies the estimated set of active transmitters and n equals the time $n_t$ for decoding when subset t of the encoders are active, the receiver will transmit a positive feedback message indicating the end of the epoch.

After the receiver commences receiving observed symbols, the receiver determines 302 whether the number of received symbols corresponds to the potential decoding time ($n_t$) indicated by the counter (t). When the clock indicates that the current time is not one of the potential decoding times, the receiver increments 308 the clock n=n+1 and continues to receive observed symbols. When the clock corresponds to one of the potential decoding times ($n_t$) from the set of potential decoding times indicated by the counter (t), the transmitter determines 310 whether a decoding rule is satisfied. In many embodiments, the first potential decoding time ($n_0$) corresponds to a period of time during which the receiver can determine that there are no active transmitters. In some embodiments, the first decoding time $n_0$ corresponds to a period of time during which the receiver can determine that current conditions fall into some preset collection of types of conditions unfavorable to successful decoding, and for which the code is design to end the epoch and declare an outage rather than trying to decode. As is discussed further below, a variety of different decoding rules can be applied at ($n_0$) to determine that there are no active transmitters and at subsequent potential decoding times to estimate the number of active transmitters. In many embodiments, the decoding rule that is utilized to estimate the number of active transmitters during the epoch can be a simple threshold rule that is applied at each potential decoding time after a determination is made that one or more transmitters are active. As is discussed further below, the specific decoding rule applied in a given receiver in accordance with an embodiment of the invention is largely dependent upon the requirements of a given application.

When the decoding rule is not satisfied, the receiver concludes that the subset of transmitters indexed by t is not the estimated active transmitter subset that is currently active and sends a negative feedback message to the transmitters. The receiver also increments the counter t=t+1 and the clock n=n+1 and continues to receive observed symbols. When the decoding rule is satisfied, the receiver decodes 314 the messages transmitted by the estimated active transmitter set t and broadcasts a positive feedback message to the transmitters. In some embodiments, the receiver can determine 316 whether it is prepared to initiate another epoch. In the event that the receiver wishes to commence another epoch, the receiver selects 318 one or more codebooks to be utilized by the transmitters during the next epoch and broadcasts 302 a positive feedback message to the transmitters indicating the commencement of the next epoch and specifying the chosen codebook ID(s). In the event that the receiver completes an epoch and does not want to initiate a new epoch, the process completes. In many embodiments, the receiver transmits a positive feedback message indicating the end of the epoch (so the transmitters can cease transmission) followed by a message indicating that a new epoch has not commenced.

While a number of specific processes are described above for decoding data transmitted by an unknown number of transmitters via a RAC using rateless codes with reference to FIG. 3, any of a variety of processes can be utilized in the decoding of data transmitted by multiple transmitters using rateless codes during epochs having durations determined by a receiver as appropriate to the requirements of specific applications in accordance with various embodiments of the invention. For example, a positive feedback message can indicate both the end of one epoch and the start of another epoch. In many embodiments, the transmitter and receivers commence a new epoch at a fixed time offset from the transmission of a positive feedback message by the receiver. In certain embodiments, the receiver transmits a first positive feedback message to end an epoch and a second message to commence the next epoch. In certain embodiments, the receiver can detect that an unusually large number of transmitters are attempting to transmit and send a feedback message that ends the epoch and that directs one or more of the transmitters to wait a period of time (e.g., a random number of epochs) before attempting to retry transmitting a message. Accordingly, it should be appreciated that receivers in accordance with various embodiments of the invention are not limited to any particular feedback mechanism and/or protocol.

While a variety of communication systems, transmitters, and receivers are described above with reference to FIGS. 1-3, as will be appreciated based upon the discussion below, any of a variety of transmitters and receivers that employ rateless codes similar to the nested LDPC codes described herein can be utilized in accordance with various embodiments of the invention. The discussion that follows presents a variety of approaches that can be utilized to design communication systems and to determine the set of possible decoding times to be utilized by the decoder in decoding the messages from the transmitters in a given application. Furthermore, the threshold that can be applied as a decoding rule in some embodiments is derived. In order to discuss communication systems in accordance with various embodiments of the invention in more detail, it is helpful to define a set of notations that can be helpful in describing the memoryless symmetric random access channel model employed in designing communication systems in accordance with many embodiments of the invention and the resulting communication systems.

Notations

For non-negative integers a and b, let $[a] \triangleq \{1, 2, \ldots, a\}$, and $[a:b] \triangleq \{a, a+1, \ldots, b\}$, where $[a:b] = \emptyset$ when $a > b$. Uppercase letters (e.g., X and Y) are employed to denote random variables, lowercase letters to denote their realizations (e.g., x and y), and calligraphic uppercase letters (e.g., $\mathcal{X}$ and $\mathcal{Y}$) to indicate their sample spaces. Superscripts (e.g., $X^n$) are utilized to represent vectors and bold fonts (e.g., X, 1 and 0) when the length of the vector is clear in the context. The subscript i in $X_i$ and bracket notation $X(i)$ both indicate the ith element of the vector X. The inequality symbols (e.g., $>$ and $\leq$) operate element-wise when used for comparing vectors (e.g., $X^n > Y^n$ if $X_i > Y_i$ for all $i \in [n]$). Likewise, applying a scalar function $f(\cdot)$ to a vector $X \in \mathbb{R}^n$ gives the vector of function values $f(X) \triangleq (f(X_i), i \in [n])$. For a finite set $\mathcal{A} \in [k]$, $|\mathcal{A}|$ represents the cardinality of $\mathcal{A}$ and $2^{\mathcal{A}} \triangleq \{ \mathcal{S} : \mathcal{S} \subseteq \mathcal{A} \}$ denotes the power set of $\mathcal{A}$. Given a scalar $a \in \mathbb{R}$, a vector $v \in \mathbb{R}^n$, and a set $\mathcal{S} \subseteq \mathbb{R}^n$, the set $a\mathcal{S}+v$ is defined as $a\mathcal{S}+v \triangleq \{as+v, s \in \mathcal{S}\}$.

Throughout the discussion that follows, unless otherwise indicated, all logarithms and exponentials are evaluated with base q, where the prime power q specifies the alphabet size of our proposed LDPC code. Standard asymptotic notations $O(\cdot)$ and $o(\cdot)$ are applied to describe the limiting behavior of functions, writing $f(n)=O(g(n))$ if there exist constants a and n' such that $|f(n)| \leq a|g(n)|$ for all $n > n'$ and $f(n)=o(g(n))$ if $$\lim_{n \to \infty} \left| \frac{f(n)}{g(n)} \right| = 0.$$

For a joint distribution $P_{XY}$ on discrete alphabet $\mathcal{X} \times \mathcal{Y}$ and any $x \in \mathcal{X}$ and $y \in \mathcal{Y}$, information density is denoted by $$i(x; y) \triangleq \log \frac{P_{Y|X}(y|x)}{P_Y(y)}. \tag{1}$$

Given a set of alphabets $\mathcal{X}_i$, $i \in [k]$, a joint distribution $P_{X^k Y}$ for some integer k, and ordered sets $\mathcal{A}, \mathcal{B} \subseteq [k]$ such that $\mathcal{A} \cap \mathcal{B} = \emptyset$, $\mathcal{X}_\mathcal{A} \triangleq \prod_{i \in \mathcal{A}} \mathcal{X}_i$ and information density and conditional information density can be defined as $$i(x_A; y) \triangleq \log \frac{P_{Y|X_A}(y|x_A)}{P_Y(y)} \tag{2}$$

$$i(x_A; y|x_B) \triangleq \log \frac{P_{Y|X_A, X_B}(y|x_A, x_B)}{P_{Y|X_B}(y|x_B)}, \tag{3}$$

for any $x_A \in \mathcal{X}_A$, $x_B \in \mathcal{X}_B$, and $y \in \mathcal{Y}$.

The corresponding mutual informations, dispersions, conditional dispersions, third centered moments, conditional third centered moments of the information density (2) and conditional information density (3) are $$I(P_{X_\mathcal{A}}) \triangleq \mathbb{E}[i(X_\mathcal{A}; Y)] \tag{4}$$

$$I(P_{X_\mathcal{A}} | P_{X_\mathcal{B}}) \triangleq \mathbb{E}[i(X_\mathcal{A}; Y|X_\mathcal{B})] \tag{5}$$

$$V(P_{X_\mathcal{A}}) \triangleq \mathrm{Var}[i(X_\mathcal{A}, Y)] \tag{6}$$

$$V(P_{X_\mathcal{A}} | P_{X_\mathcal{B}}) \triangleq \mathrm{Var}[i(X_\mathcal{A}; Y|X_\mathcal{B})] \tag{7}$$

$$V^Y(P_{X_\mathcal{A}}) \triangleq \mathrm{Var}[i(X_\mathcal{A}; Y)|Y] \tag{8}$$

$$V^Y(P_{X_\mathcal{A}} | P_{X_\mathcal{B}}) \triangleq \mathrm{Var}[i(X_\mathcal{A}; Y|X_\mathcal{B})|Y] \tag{9}$$

$$T(P_{X_\mathcal{A}}) \triangleq \mathbb{E}\left[|i(X_\mathcal{A}; Y) - I(P_{X_\mathcal{A}})|^3\right] \tag{10}$$

$$T(P_{X_\mathcal{A}} | P_{X_\mathcal{B}}) \triangleq \mathbb{E}\left[|i(X_\mathcal{A}; Y|X_\mathcal{B}) - I(P_{X_\mathcal{A}} | P_{X_\mathcal{B}})|^3\right] \tag{11}$$

$$T^Y(P_{X_\mathcal{A}}) \triangleq \mathbb{E}\left[|i(X_\mathcal{A}; Y) - I(P_{X_\mathcal{A}})|^3 | Y\right] \tag{12}$$

$$T^Y(P_{X_\mathcal{A}} | P_{X_\mathcal{B}}) \triangleq \mathbb{E}\left[|i(X_\mathcal{A}; Y|X_\mathcal{B}) - I(P_{X_\mathcal{A}} | P_{X_\mathcal{B}})|^3 | Y\right]. \tag{13}$$

The (probability density function) PDF and cumulative distribution function (CDF) for standard Gaussian distribution $\mathcal{N}(0, 1)$ are denoted by $$\phi(x) \triangleq \frac{1}{\sqrt{2\pi}} e^{-\frac{x^2}{2}} \tag{14}$$

$$\Phi(x) \triangleq \frac{1}{\sqrt{2\pi}} \int_{-\infty}^{x} e^{-\frac{u^2}{2}} du, \tag{15}$$

respectively. The function $Q(\cdot)$ denotes the standard Gaussian complementary CDF $$Q(x) \triangleq 1 - \Phi(x) = \frac{1}{\sqrt{2\pi}} \int_{x}^{\infty} e^{-\frac{u^2}{2}} du, \tag{16}$$

and $Q^{-1}(\cdot)$ is the inverse function of $Q(\cdot)$.

The generalization of inverse Gaussian complementary CDF $Q^{-1}(\cdot)$ to higher dimension is denoted by $Q_{inv}(\cdot, \cdot)$. Let Z be a Gaussian random vector in $\mathbb{R}^d$ with mean zero and covariance matrix K, the set $Q_{inv}(K, \epsilon)$ is given by $$Q_{inv}(K, \epsilon) \triangleq \{z \in \mathbb{R}^d : Pr[Z \leq z] \geq 1 - \epsilon\}. \tag{17}$$

Given a positive integer n, a prime power q, and a PDF $\theta = (\theta_0, \theta_1, \ldots, \theta_{q-1})$ such that $n\theta_i \in \mathbb{Z}$, $\forall i \in [0, q-1]$, the multinomial coefficient $B(n, n\theta)$ is defined as $$B(n, n\theta) \triangleq \frac{n!}{\prod_{i=0}^{q-1} (n\theta_i)!}. \tag{18}$$

A summary of many of the notations utilized herein is provided in Table 1 shown in FIG. 4.

System Model and Design

When considering the RAC, the maximum number of transmitters K can be assumed finite, i.e., $K < \infty$. A K-user DM-MAC can then be denoted by DM-K-MAC. A DM-K-MAC can be defined by $$\left( \prod_{i=1}^{K} \mathcal{X}_i, P_{Y|X}, \mathcal{Y} \right)$$

where $\mathcal{X}_i$, $i \in [K]$, and $\mathcal{Y}$ are the discrete channel input and output alphabets, respectively, and $P_{Y|X} = P_{Y|X_1, X_2, \ldots, X_K}$ is the channel transition probability.

A DM-K-MAC is called symmetric if all transmitters share the same input alphabet ($\mathcal{X}_i = \mathcal{X}$ for all $i \in [K]$) and $$P_{Y|X}(y|x) = P_{Y|X}(y|\pi(x))$$

for all $y \in \mathcal{Y}$, $x \in \mathcal{X}^K$, and permutations $\pi$ on [K].

The nth order extension $(\prod_{i=1}^{K} \mathcal{X}_i^n, P_{Y^n|X^n}, \mathcal{Y}^n)$ of a memoryless channel $(\prod_{i=1}^{K} \mathcal{X}_i, P_{Y|X}, \mathcal{Y})$ requires that $$Pr[y^n|x^n, y^{n-1}] = Pr[y_n|x_n], \tag{19}$$

for all $k \in [n]$.

The RAC can be considered to be part of a family of all possible MACs resulting from different transmitter patterns. A DM-RAC can be described by a collection of symmetric DM-MACs $$\{(\mathcal{X}^k, P_{Y_k|X^k}, \mathcal{Y}_k)\}_{k=0}^{K}, \tag{20}$$

where $\mathcal{X}^k$, $P_{\mathcal{Y}_k|\mathcal{X}^k}$, and $\mathcal{Y}_k$ are the channel input alphabet, channel transition probability, and channel output alphabet when there are k active transmitters, respectively.

RAC Communication Protocol

When the RAC communication protocol described above is utilized, transmissions happen in epochs, where each new epoch starts after a positive feedback message is sent from the decoder at one of a predetermined set of times $n_i$, $i \in [0, K]$ during the previous epoch. At the beginning of each new epoch, each transmitter independently decides whether to be silent or active until the end of this epoch. As a result, except in cases where a transmitter has to end its transmission prematurely (due, for example, to a battery dying or a transmitter moving out of range from the receiver), the set of transmitters remains unchanged for each epoch. The variation between epochs is simply a function of the specific transmitters within the set of transmitters that are active during a given epoch.

The decoder can send feedback (e.g., a single bit feedback) at each of the predetermined decoding times $n_i$, $i \in [0, K]$ to signal the transmitters to continue the transmission (a negative feedback bit), or stop the transmission and start a new epoch (a positive feedback bit). In many embodiments, the set of decoding times $n_i$, $i \in [0, K]$ are chosen such that the decoder is able to detect, using a hypothesis test $h_0(\cdot)$, whether any transmitter is active at time $n_0$, and it is capable of decoding the messages at time $n_k$ if it concludes from a testing function $h_k(\cdot)$ that the number of active transmitters is k in that epoch. Potential hypothesis testing functions $h_k(\cdot)$ that can be utilized in accordance with various embodiments of the invention are discussed further below. In many embodiments, $n_0 < n_1 < n_2 < \ldots < n_K$, as a larger number of active transmitters makes it more difficult to decode the messages. However, $n_0 < n_1 < n_2 < \ldots < n_K$ does not hold in all embodiments.

Quantized Coset Random Access LDPC (RA-LDPC) Code Design

Figure 5:
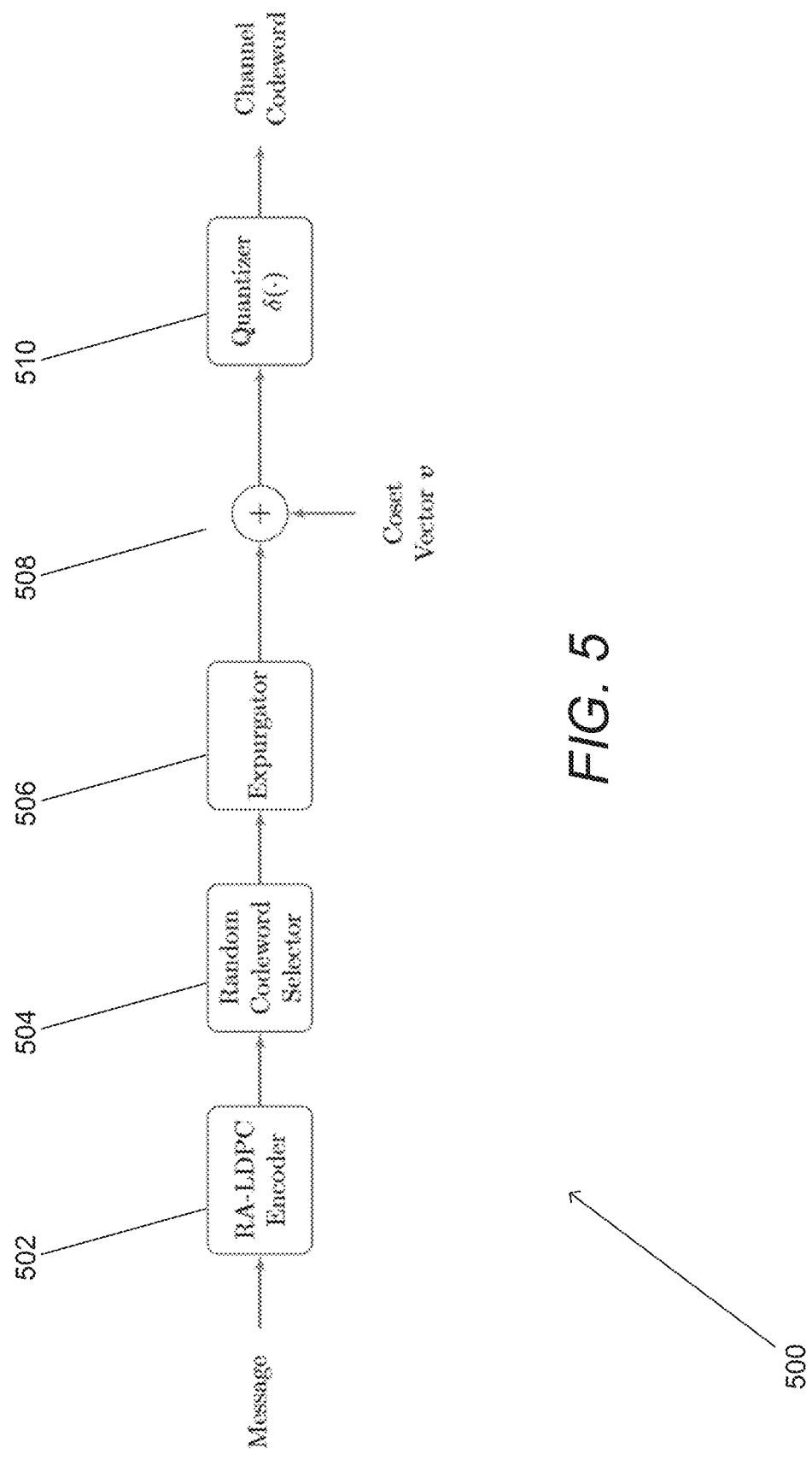
FIG. 5 conceptually illustrates a Low Density Parity Check (LDPC) encoder in accordance with an embodiment of the invention.

For any prime power q and finite Galois Field GF(q), a quantized coset Random Access GF(q)-LDPC (RA-LDPC) code can be constructed in the manner illustrated in FIG. 5. In the illustrated embodiment, the nested LDPC code generator 500 includes an RA-LDPC encoder 502, a random codeword selector 504 (fixing operational rate to design rate), an expurgator (removing codes with small minimum distances) 506, a coset vector v 508, and a quantizer 510 (matching channel input distribution). While a specific LDPC code generator is illustrated in FIG. 5, any of a variety of different LDPC code generator implementations can be utilized to generate LDPC codes for the purposes of encoding user message bits using a quantized coset RAC GF(q)-LDPC code as appropriate to the requirements of specific applications in accordance with various embodiments of the invention.

For a K-user RAC, a RA GF(g)-LDPC code can be defined on a bipartite Tanner graph $\mathcal{G} = (\mathcal{V}, \varepsilon)$ with $n_K$ variable nodes, $r_k$ check nodes, and edge set $\varepsilon \subseteq [n_K] \times [r_K]$ using a K-stage design.

For each stage $i \in [K]$, the code can be constructed as follows:

When i=1, the LDPC code is a length-$n_1$ regular LDPC code with variable node degree (left degree) $\lambda_1$ and check node degree (right degree) $\rho_1$. The number of check nodes $r_1$ satisfies $n_1 \lambda_1 = r_1 \rho_1$.

When i=2, there are $n_{\Delta 2} \triangleq n_2 - n_1$ additional variable nodes and $r_{\Delta 2} \triangleq r_2 - r_1$ additional check nodes. All the $n_2$ variable nodes add $\rho_2$ sockets each, which are connected to the additional $r_{\Delta 2}$ check nodes of degree $\lambda_2$. The number of check nodes $r_{\Delta 2}$ satisfies $n_2 \lambda_2 = r_{\Delta 2} \rho_2$.

When $3 \leq i < K$, $n_{\Delta i} \triangleq n_i - n_{i-1}$ additional variable nodes and $r_{\Delta i} \triangleq r_i - r_{i-1}$ are added. $\lambda_i$ additional sockets are added to each of the $n_i$ variable nodes, which are connected to the $r_{\Delta i}$ check nodes of degree $\rho_i$. The number of check nodes $r_{\Delta i}$ satisfies $n_i \lambda_i = r_{\Delta i} \rho_i$.

In the embodiment described here, edge weights and connections are chosen at random. In other embodiments, they could be designed in other ways. Many of the nested LDPC codes described herein are regular LDPC codes. In many embodiments, irregular nested LDPC codes are utilized as appropriate to the requirements of specific applications.

For each $(i, j) \in \varepsilon$, $(i, j)$ represents an undirected edge connecting the ith variable node and the jth check node; each edge value $g_{i,j}$ is chosen uniformly at random from $GF(q) \backslash \{0\}$. The notation $$\mathcal{N}(j) \triangleq \{i : (i, j) \in \varepsilon\},$$

captures the neighborhood of check node $j \in [r_K]$ resulting from edge set $\varepsilon$.

The $n_K$ variable nodes hold a length-$n_K$ vector u from $GF(q)^{n_K}$. Vector u is a codeword if it satisfies all the $r_K$ check nodes, giving $$\sum_{i \in \mathcal{N}(j)} g_{i,j} u_i = 0 \; \forall \; j \in [r_K]; \quad (21)$$

the linear equation operates in GF(q). The set of all $M = |c|$ codewords constitute the codebook $$c = \{c_1, \ldots, c_M\} \subseteq GF(q)^{n_K}$$

for the given Tanner graph $\mathcal{G} = (\mathcal{V}, \varepsilon)$. In some embodiments, all the K transmitters employ the same RA-LDPC codebook.

It is important to stress that while the $r_{\Delta k}$ check nodes, added in stage-k design, can potentially connect to any of the $n_k$ variable nodes, the additional $n_{\Delta k}$ variable nodes can only connect to the $r_{\Delta k}$ incremental check nodes. Therefore, from the perspective of the $r_{\Delta k}$ incremental check nodes, the length-$n_k$ LDPC code is a regular LDPC code with left degree $\lambda_k$ and right degree $\rho_k$. It should be appreciated, however, that systems and methods in accordance with various embodiments of the invention are not limited to the use of regular LDPC codes and nested LDPC codes can be employed that utilize irregular LDPC codes.

A random ensemble of RAC GF(q)-LDPC codes can be utilized in accordance with many embodiments of the invention, where each code in the ensemble is chosen uniformly at random from all possible permutations of connecting the $\lambda_i n_i$, $i \in [K]$ sockets, and all possible edge values from $GF(q) \backslash \{0\}$ for each socket during the stage-i design. It should be appreciated, however, that systems and methods in accordance with various embodiments of the invention are not limited to the use of LDPC codes generated using uniform random design.

Figure 6:
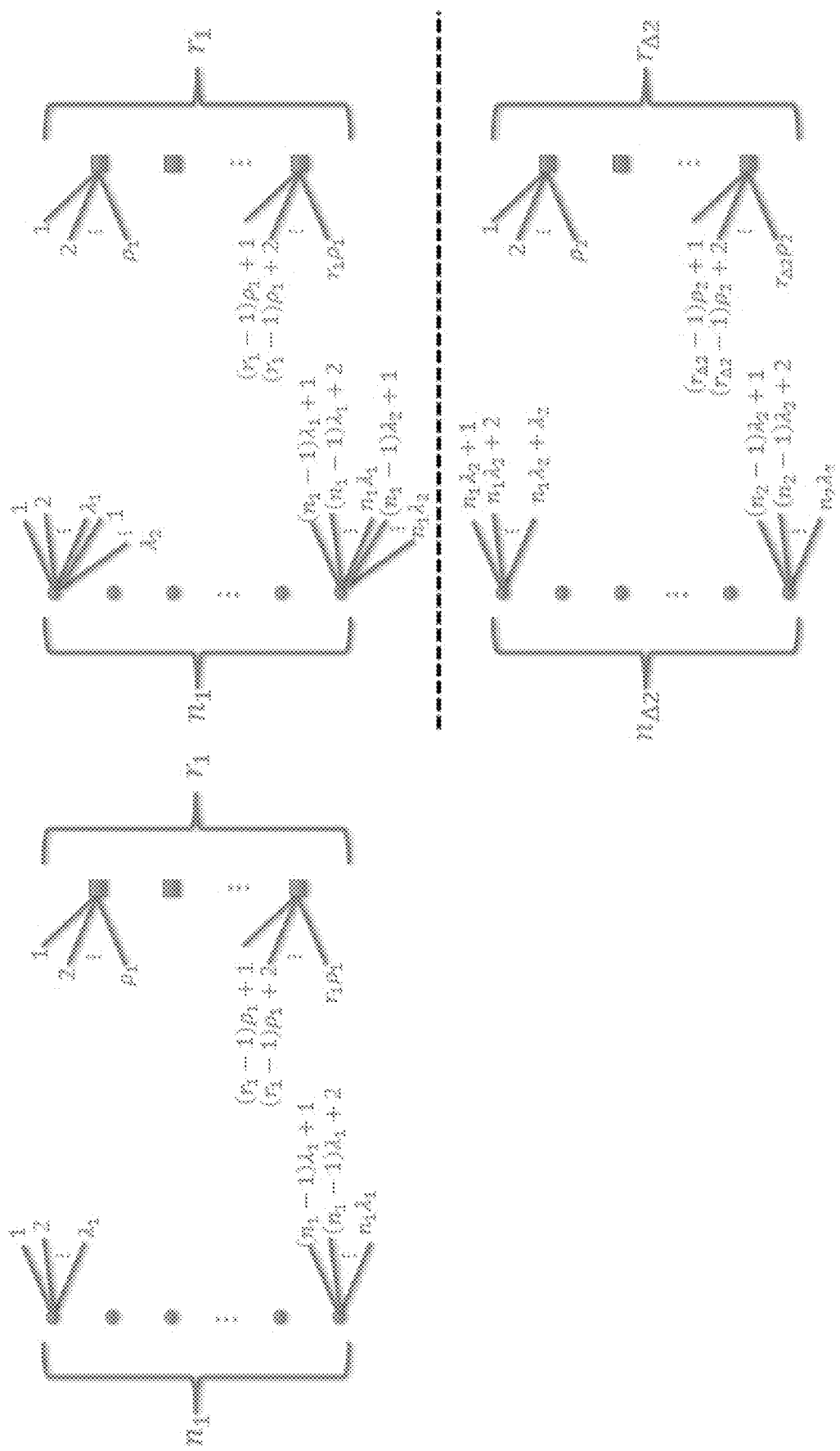
FIG. 6 conceptually illustrates the underlying design a random ensemble of Random Access LDPC (RA-LDPC) codes that can be utilized with two transmitters in accordance with an embodiment of the invention.

A design for K=2 is illustrated in FIG. 6, where left=Stage-1 design (sockets in light grey), right=Stage-2 design on top of Stage-1 design (incremental sockets in light blue), and sockets of the same color connect.

Based on the RAC code design outlined above, the following relationships can exist for the design parameters:

$$n_k = \sum_{i=1}^{k} n_{\Delta i} \quad (22)$$

$$r_k = \sum_{i=1}^{k} r_{\Delta i} \quad (23)$$

Note that choosing parameters $n_k$, $\lambda_k$, $\rho_k$ will automatically fix the corresponding number of check nodes $r_k$. For example, $$r_1 = \frac{n_1 \lambda_1}{\rho_1}, r_{\Delta 2} = \frac{n_2 \lambda_2}{\rho_2},$$

and in general $$r_{\Delta k} = \frac{n_k \lambda_k}{\rho_k}. \quad (24)$$

Therefore, the design rates, in q-ary symbols per channel use, for each blocklength $n_k$, $k \in [K]$ is $$R_1 = \frac{n_1 - r_1}{n_1} = 1 - \frac{\lambda_1}{\rho_1} \quad (25)$$

$$R_2 = \frac{n_2 - r_2}{n_2} = 1 - \frac{r_2}{n_2} \quad (26)$$

$$= 1 - \frac{\frac{n_1 \lambda_1 + n_2 \lambda_2}{n_2}}{\frac{r_1 \rho_1 + r_{\Delta 2} \rho_2}{r_2}}$$

$$= 1 - \frac{\frac{n_1}{n_2}\lambda_1 + \lambda_2}{\frac{r_1}{r_2}\rho_1 + \frac{r_{\Delta 2}}{r_2}\rho_2}$$

$$\vdots$$

$$R_K = \frac{n_K - r_K}{n_K} = 1 - \frac{r_K}{n_K} \quad (27)$$

$$= 1 - \frac{\sum_{i=1}^{K} \frac{n_i}{n_K}\lambda_i}{\sum_{i=1}^{K} \frac{r_{\Delta i}}{r_K}\rho_i}.$$

The fact that $R_i$, $i \in [K]$ are named "design rates" is deliberate, as each of the first $r_i$, $i \in [K]$ check node equations in (21) might be linearly dependent, making the actual rate larger. A significant proportion of LDPC literature assumes that the operational rate is equal to the design rate, which may not be precise for short blocklengths.

To fix the operational rate to the design rate, a random codeword selector can be utilized. Given the ensemble of RAC GF(q)-LDPC codes with design rates vector $R=(R_1, \ldots, R_K)$ from the RA-LDPC encoder, the random codeword selector can generate an ensemble by dividing the probability of each code in the original ensemble equally among all code(s) corresponding to a distinct combination of $M_k \triangleq q^{n_k R_k}$ codewords of length-$n_k$ for all $k \in [K]$ from the original code.

With some abuse of notations, the codebook at blocklength $n_k$, $k \in [K]$ can be denoted by $$c_{(k)} \triangleq \{c_{(k),1}, \ldots, c_{(k),M_k}\} \subseteq GF(q)^{n_k}. \quad (28)$$

Since the performance of an ensemble of LDPC codes is negatively affected by a small number of codes with small minimum distance, removing (expurgating) these codes can produce an ensemble with improved properties. Therefore an expurgator can be employed to remove codes with small minimum distances in the ensemble from the random codeword selector.

An expurgator utilized in accordance with many embodiments of the invention can be defined as follows. Let $P_L(C)$ denote the probability of a randomly chosen code from the ensemble resulting from the random codeword selector. The expurgator can generate an ensemble, by placing probability zero on all codes whose minimum distances for the first $n_i$, $i \in [K]$ symbols (denoted by $d_{min}^{n_i}(C)$) is less than or equal to $\sigma_i n_i$, and probability $P_L(C|d_{min}^{n_i}(C) > \sigma_i n_i, \forall i \in [K])$ on code C whose minimum distance is greater than $\sigma_i n_i$. The values of $\sigma = (\sigma_1, \ldots, \sigma_K)$ can be chosen such that $\Pr[d_{min}^{n_i}(C)] = O(n_i^{\lambda_i/2-1})$ for all $i \in [K]$.

Quantized coset coding can be applied before transmitting the codewords over the channel. Given the Tanner graph $\mathcal{G} = (\mathcal{V}, \varepsilon)$ of a RA-LDPC encoder and the corresponding LDPC codebook c from the expurgator, the coset LDPC code can be constructed by adding a constant vector v chosen uniformly at random from $GF(q)^{n_K}$, called the coset vector, to each codeword $c_i \in c$. The addition $$c_i + v, \ i \in [M]$$

is performed component-wise in GF(g). The set $\{c_i + v, i \in [M]\}$ is the codebook for the coset GF(g)-LDPC code. Each of the K transmitters can be given an independently generated coset vector $v_i$, $i \in [K]$. It should be appreciated, however, that systems and methods in accordance with various embodiments of the invention are not limited to the use of LDPC codes developed using uniform coset random design and that any of a variety of LDPC codes including (but not limited to) codes built using nested LDPC codes can be employed as appropriate to the requirements of specific applications.

The random coset vectors can play an important role in the LDPC codes utilized in accordance with many embodiments of the invention, by effectively enlarging the support of the random LDPC code ensemble. Given a coset LDPC codebook $\{c_i + v, i \in [M]\}$, each symbol from each codeword $c_i + v$ is mapped to a symbol from the channel input alphabet $\mathcal{X}$ using a quantizer $\delta$:

$$\delta: GF(q) \to \mathcal{X}. \quad (29)$$

Mapping $\delta$ is applied component-wise; therefore the following notation can be employed $$\delta(c_i + v) \triangleq [\delta((c_i + v)_j)]_{j \in [n]}$$

for coset codeword $c_i + v$.

The set $\{\delta(c_i + v), i \in [M]\}$ is the codebook for the quantized coset GF(g)-LDPC code. All the K transmitters can adopt the same quantizer $\delta(\cdot)$. In many embodiments, the design is not limited to the use of a similar quantizer.

Figure 7:
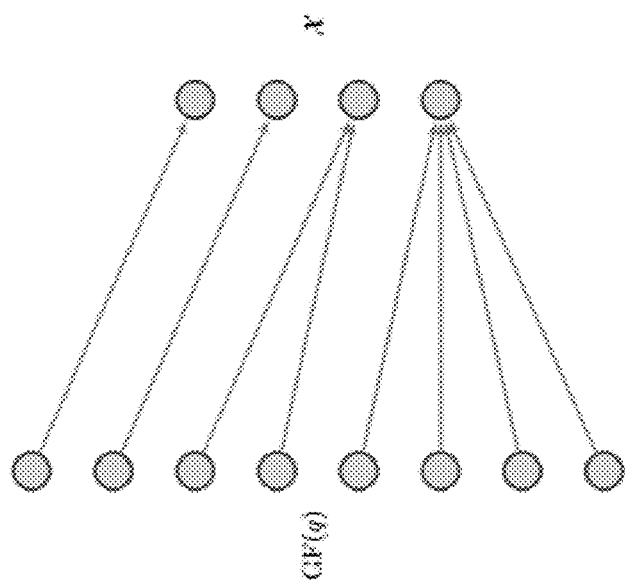
FIG. 7 conceptually illustrates a quantizer in accordance with an embodiment of the invention.

An example quantizer is illustrated in FIG. 7, which maps symbols from GF(q) with prime power $q=2^3$ to channel input symbols with $|\mathcal{X}|=4$, such that $P_X=(\frac{4}{8}, \frac{2}{8}, \frac{1}{8}, \frac{1}{8})$.

In some embodiments, even though all the k-MAC, $k \in [K]$, in the RAC model described above are assumed to be symmetric, the capacity-achieving distribution $P_X^*$ might vary with the number of active transmitters, the design allows the quantizers to vary in different incremental sub-blocks.

The random ensemble resulting from the application of random RA-LDPC encoder, random codeword selector, and expurgator can be labelled as LDPC–$\{(\lambda_i, \rho_i; n_i)\}_{i=1}^K$. Before transmission starts, the chosen RA-LDPC codebook, coset vector, and quantizer can be disclosed to all transmitters and the receiver within the communication system.

Decoder Design

In many embodiments, the decoder is tasked with two goals: first estimating the number of active transmitters and then decoding the messages based on the estimated number of active transmitters (if any). Recall that the transmissions happen in epochs, and the decoder sends positive feedback (e.g., a positive feedback bit) at the end of each epoch to signify the start of a new epoch. The decoding protocol can be described by a two-stage process:

1. Stage 1: Estimating the Number of Active Transmitters. The first stage is a hypothesis test with K+1 testing functions $h_i(\cdot)$ with K+1 thresholds $\gamma_i$, $i \in [0, K]$ that determines whether there are any active transmitters at time $n_0$, and if so, how many active transmitters there are at time $n_i$, $i \in [K]$. If the hypothesis test threshold is fulfilled at time $n_0$, then the decoder declares there are no active transmitters for the current epoch and a positive acknowledgement is sent to signal the start of next epoch. Otherwise, the decoder enters the second stage upon passing the first testing function $h_k(\cdot)$ at time $n_k$ for some $k \in [K]$.

2. Stage 2: Decoding the Messages based on the Number of Active Transmitters. The second stage can be (but is not limited to being) a ML decoder with K decoding functions $g_k(\cdot)$, $k \in [K]$ that maps the received symbols $y^{n_k} \in \mathcal{Y}_k^{n_k}$ to $(\mathcal{X}^k)^{n_k}$. Positive feedback can be sent at time $n_k$ to conclude the current epoch, and a new epoch can commence at the next time step. Each transmitter can then decide whether to start a new transmission or remain silent for the new epoch, until the next positive feedback bit is received. In a number of embodiments, the second stage can be implemented using a belief propagation (e.g., message passing) decoder.

The ML decoder $g_k(\cdot)$ for $k \in [K]$ active transmitters can be formally defined as $$g_k(y^{n_k}) = \begin{cases} \arg\max\limits_{m \in [M_k]^k} P_{Y_k|X^k}^{n_k}(y^{n_k} \mid x_m^{n_k}) & \text{if } h_k(y^{n_k}) \le \gamma_k \\ \text{No Decoding} & \text{otherwise} \end{cases} \quad (30)$$

where $$x_m^{n_k} \triangleq (\delta(c_{(k),m(1)} + v_{1,[n_k]}), \ldots, \delta(c_{(k),m(k)} + v_{k,[n_k]}))$$

is the length-$n_k$ quantized coset-shifted codewords for messages m, and $h_k(\cdot)$ and $\gamma_k$ are the hypothesis test function and threshold.

A decoding is declared to be successful if both the number of active transmitters and the corresponding messages are correctly determined.

Hypothesis Tests

By way of an example of an hypothesis test that can be utilized in accordance with an embodiment of the invention, given the DM-RAC model $\{(\mathcal{X}^k, P_{Y_k|X^k}, \mathcal{Y}_k)\}_{k=0}^K$, there exists a hypothesis test function $h(\cdot)$ and threshold $\gamma_0$ such that $$Pr[h(Y_k^{n_0}) \le \gamma_0] \le \frac{E_k}{\sqrt{n_k}} \quad (31)$$

$$Pr[h(Y_0^{n_0}) > \gamma_0] \le \epsilon_0', \quad (32)$$

for some chosen target error probability $\epsilon_0'$, and constant $E_k > 0$, provided $n_0 \ge c_0 \log n_1 + o(\log n_1)$ for some known constant $c_0 > 0$. Here $Y_i$, $i \in [0, K]$ is the output distribution with i number of active transmitters and capacity-achieving input distribution $P_X^*$.

In addition, when $P_{Y_i} \ne P_{Y_j}$ for all $i \ne j$, $i, j \in [K]$, then there exist K log-likelihood ratio (LLR) hypothesis test, functions $h_i(\cdot)$ and thresholds $\gamma_i$, $i \in [0, K]$ that can achieve the optimal second-order term for $n_0$. However, this does not change the dominant term, i.e., $$Pr[h_k(Y_k^{n_k}) \le \gamma_k] = O\left(\frac{1}{\sqrt{n_k}}\right).$$

Error Analyses

Systems and methods in accordance with various embodiments of the invention that utilize Quantized Coset RA-LDPC codes can be analyzed using error-exponent analysis and dispersion-style analysis. A comparison of both approaches can reveal that the error-exponent analysis achieves a sub-optimal bound at small blocklength n but a superior performance when target error probability $\epsilon$ is small.

Before presenting the analyses, the quanity ensemble-average number of codewords is defined. Denote the type of a vector $u \in GF(q)^n$ as $$\mathcal{T}_Q^N(u) \triangleq (N(g|u), g \in Q), \quad (33)$$

where $N(g|u)$ is the number of occurrence for element g in the vector u. The set of all possible types of a length-$n_i$ vector from $GF(q)^{n_i}$, $i \in [K]$ is denoted by $$\mathcal{T}_Q^{n_i} \triangleq \{\mathcal{T}_Q^{n_i}(u) : u \in GF(q)^{n_i}\} \in \mathbb{Z}_+^{|Q|}.$$

For a given codebook c from the LDPC–$\{(\lambda_i, \rho_i; n_i)\}_{i=1}^K$ ensemble, the number of type-$n_i\theta_i$, $n_i\theta_i \in \mathcal{T}_Q^{n_i}$ codewords in c is denoted by $S_c^{n_i}(\theta_i)$ $$S_c^{n_i}(\theta_i) = \sum_{m=1}^{q^{n_i R_i}} \mathbb{1}\{\mathcal{T}_Q^{n_i}(c_m) = n_i \theta_i\}. \quad (34)$$

The ensemble-average spectrum of the LDPC–$\{(\lambda_i, \rho_i; n_i)\}_{i=1}^K$ ensemble at, each blocklength $n_i$ (for which the total number of check nodes is $r_i$) is $$\bar{S}_{L,r_i}^{n_i} \triangleq \mathbb{E}_c[S_c^{n_i}] = \{\bar{S}_{L,r_i}^{n_i}(\theta_i) : n_i\theta_i \in \mathcal{T}_Q^{n_i}\}, \forall i \in [K]. \quad (35)$$

Error-Exponent Analysis

Given a RAC model $\{(\mathcal{X}^k, P_{Y_k|X^k}, \mathcal{Y}_k)\}_{k=0}^K$, where a single distribution $P_X^*$ achieves the capacity for different numbers of active transmitters, the ensemble-average probability of the proposed RA-LDPC ensemble can be bounded. Recall that if there are k active transmitters, a correct decoding typically requires that the decoder determine both the number of active transmitters and their messages at time $n_k$.

Consider any DM-RAC $\{(\mathcal{X}^k, P_{Y_k|X^k}, \mathcal{Y}_k)\}_{k=0}^K$ defined above, where a single distribution $P_X^*$ achieves the capacity for all possible numbers of active transmitters $k \in [K]$. Let $\delta: GF(q) \to \mathcal{X}$ be a quantization matched to $P_X^*$. The ensemble-average error probability of the quantized coset-shifted LDPC–$\{(\lambda_i, \rho_i; n_i)\}_{i=1}^K$ ensemble, at blocklength $n_k$ for k active transmitters, satisfies $$\epsilon_k \leq q^{-nE_{P_k}\left[kR_k + \frac{\log \alpha_k}{n_k}\right]} \quad (36)$$

$$+ \sum_{i=0}^{k-1} Pr[h_i(Y_i^{n_i}) \leq \gamma_i] + Pr[h_k(Y_k^{n_k}) > \gamma_k], \quad (37)$$

and the probability of failing to detect that no transmitter is active at time $n_0$ is $$\epsilon_0 \leq Pr[h_0(Y_0^{n_0}) > \gamma_0], \quad (38)$$

where $h_i(\cdot)$ and $\gamma_i$, $i \in [0, K]$ are hypothesis test functions and corresponding thresholds, $E_{P_k}(\cdot)$, $k \in [K]$ is Gallager's error exponent for the input distribution $P_{X^k}^* = (P_X^*)^k$ $$E_{P_k}(R) \triangleq \max_{0 \leq \tau \leq 1} E_0(\tau, P_{X^k}^*) - \tau R \quad (39)$$

$$E_0(\tau, P_{X^k}^*) \triangleq -\log \sum_{y \in \mathcal{Y}_k} \left[ \sum_{x \in \chi^k} P_{X^k}^*(x) P_{Y_k|X^k}(y|x)^{\frac{1}{1+\tau}} \right]^{1+\tau}, \quad (40)$$

$\alpha_k$ is a penalty of the LDPC encoder, defined using $$\alpha_k \triangleq \frac{1}{(M_k - 1)q^{-n_k}} \max_{\theta_k : n_k \theta_k \in \mathcal{T}_Q^{n_k}} \frac{\overline{S}_{L,r_k}^{n_k}(\theta_k)}{B(n_k, n_k \theta_k)}, \quad (41)$$

and $M_k = q^{n_k R_k}$ is the number of codewords at blocklength $n_k$ and design rate $R_k$.

When there is no active transmitter, the probability of failing to detect that no transmitter is active using hypothesis test function $h_0(\cdot)$ (38) is bounded. When the number of active transmitters is k for some $k \in [K]$, the probability of incorrect decoding using Gallager's error exponents (36) and hypothesis test functions (37) is also bounded.

On one hand, the performances of hypothesis tests can be determined. The probability of incorrectly estimating the true number of active transmitters decay as $O(1/\sqrt{n_k})$. On the other hand, Gallager's error exponent $E_P(R)$ is strictly positive $E_P(R) > 0$ for any $R < C$ (assuming using capacity achieving distribution $P_X^*$) for any discrete memoryless point-to-point (DM-PPC) with capacity $C > 0$. Similarly, $E_p(kR_k) > 0$ for all $kR_k < kC_k$ in the DM-k-MAC (where $kR_k$ is the symmetrical sum-rate and $kC_k$ is the maximum symmetrical sum-rate).

If the performance of i.i.d. random codes drawn from $P_X^*$ is bounded, then the only difference between i.i.d. codes and the codes described herein will be the error exponent in (36). For i.i.d. random codes, the error exponent will be $$q^{-nE_{P_k}[kR_k]}.$$

Therefore, $$\frac{\log \alpha_k}{n_k}$$

in (36) can be referred to as the per-transmitter rate offset for using a low-density encoder.

Evaluation of Rate Offsets $$\frac{\log \alpha_k}{n_k}, k \in [K]$$

Given any RA-LDPC code ensemble LDPC-$\{(\lambda_i, \rho_i; n_i)\}_{i=1}^K$, the rate offsets $$\frac{\log \alpha_k}{n_k}, k \in [K]$$

behave as $$\frac{\log \alpha_k}{n_k} = O\left(\frac{\log n_k}{n_k}\right), \quad (42)$$

where $$\alpha_k = \frac{1}{(M_k - 1)q^{-n_k}} \max_{\theta_k : n_k \theta_k \in \mathcal{T}_Q^{n_k}} \frac{\overline{S}_{L,r_k}^{n_k}(\theta_k)}{B(n_k, n_k \theta_k)}, \quad (43)$$

provided that the density $$\kappa_i \triangleq \frac{\rho_i}{n_i}$$

decays no more quickly than $$\frac{\log\left(\frac{\log n_i}{n_i}\right)}{n_i \log(b_i)},$$

where $b_i < 1$ is some known constant that depends on q and the expurgator threshold $\sigma_i$, for all $i \in [k]$.

The densities of the LDPC code $$\kappa_i = \frac{\rho_i}{n_i}, i \in [K]$$

represent a trade-off between the performance and the complexity. A higher $\kappa$ yields better LDPC code performance at the cost of higher decoding complexity, and a lower $\kappa$ reduces the decoding complexity with worse performance.

Recall that when $n_k \theta_k$ is a type, $\overline{S}_{L,r_k}^{n_k}(\theta_k)$ is the expected number of codewords of type $n_k \theta_k$ in the randomly drawn single-transmitter codebook $C_{(k)}$ from the LDPC-$\{(\lambda_i, \rho_i; n_i)\}_{i=1}^K$ ensemble.

For simplicity of notations, the following derivation assumes that the number of active transmitters is k=2. Similar arguments hold for any k>2.

When k=2, the LDPC code includes two categories of check nodes, where the first $r_1$ check nodes only connect to the first $n_1$ symbols (variable nodes), and the second incremental $r_{\Delta 2}$ check nodes connect to all the $n_2$ symbols. Hence, given a type $n_2 \theta_2$, all possible "sub-types" of the first $n_1$ variable nodes can be separated. That is, the compatible set of types can be defined as $$\mathcal{S}_{comp}(\theta_1|\theta_2) \triangleq \{\theta_1 : n_1 \theta_1 \in \mathcal{T}_{Q^{n_1}}, n_1 \theta_1 \leq n_2 \theta_2\}. \quad (44)$$

For a given $\theta_2$ and some compatible $\theta_1$, the incremental type can be defined as the type of the incremental $n_{\Delta 2}$ symbols. That is, $$\theta_{\Delta 2} \triangleq \frac{n_2\theta_2 - n_1\theta_1}{n_{\Delta 2}}.$$

The process of evaluating $\overline{S}_{L,r_2}^{n_2}(\theta_2)$ is as follows. Let $\mathcal{M}(n_1\theta_1, n_{\Delta 2}\theta_{\Delta 2})$ denote all possible codewords of sub-type pair $(n_1\theta_1, n_{\Delta 2}\theta_{\Delta 2})$. Then $$\begin{aligned}
\overline{S}_{L,r_2}^{n_2}(\theta_2) & \\
= \sum_{\theta_1 \in S_{comp}(\theta_1|\theta_2)} & \overline{S}_{L,r_2}^{n_2}(\theta_1, \theta_{\Delta 2}) \\
= \sum_{\theta_1 \in S_{comp}(\theta_1|\theta_2)} & \mathbb{E}_{C_{(2)}}\left[\sum_{c_0 \in \mathcal{M}(n_1\theta_1, n_{\Delta 2}\theta_{\Delta 2})} 1\{c_0 \in C_{(2)}\}\right] \\
= \sum_{\theta_1 \in S_{comp}(\theta_1|\theta_2)} & \sum_{c_0 \in \mathcal{M}(n_1\theta_1, n_{\Delta 2}\theta_{\Delta 2})} \mathbb{E}_{C_{(2)}}[1\{c_0 \in C_{(2)}\}] \\
= \sum_{\theta_1 \in S_{comp}(\theta_1|\theta_2)} & \sum_{c_0 \in \mathcal{M}(n_1\theta_1, n_{\Delta 2}\theta_{\Delta 2})} Pr[c_0 \in C_{(2)}] \\
\stackrel{(a)}{=} \sum_{\theta_1 \in S_{comp}(\theta_1|\theta_2)} & B(n_1, n_1\theta_1)B(n_{\Delta 2}, n_{\Delta 2}\theta_{\Delta 2}) \cdot Pr\left[c_{n_1\theta_1, n_{\Delta 2}\theta_{\Delta 2}} \in C_{(2)}\right],
\end{aligned} \quad (45)$$

where $B(n_1, n_1\theta_1)B(n_{\Delta 2}, n_{\Delta 2}\theta_{\Delta 2})$ is the size of the set $\mathcal{M}(n_1\theta_1, n_{\Delta 2}\theta_{\Delta 2})$ (the number of ways to permute a length-$n_2$ vector of type sub-type pair $(n_1\theta_1, n_{\Delta 2}\theta_{\Delta 2})$), $c_{n_1\theta_1, n_{\Delta 2}\theta_{\Delta 2}}$ is any fixed codeword in $\mathcal{M}(n_1\theta_1, n_{\Delta 2}\theta_{\Delta 2})$, and ($\alpha$) follows from the symmetry of the code design (no codeword is treated any better or worse than any other codewords).

To calculate the probability that a codeword of length $n_2$ and sub-type $(n_1\theta_1, n_{\Delta 2}\theta_{\Delta 2})$ is in the random codebook $C_{(2)}$, it should be noted that there are $B(n_1\lambda_1, n_1\lambda_1\theta_1)B(n_2\lambda_2, n_2\lambda_2, n_2\lambda_2\theta_2)$ equally likely assignments of variable node values to sockets that are consistent with PDF $(\theta_1, \theta_{\Delta 2})$. Combining this number with the q−1 possible values for each edge, we find that there are $$t((\theta_1,\theta_{\Delta 2}), n_2)\triangleq (q-1)^{n_1\lambda_1+n_2\lambda_2}\cdot B(n_1\lambda_1, n_1\lambda_1\theta_1)B(n_1\lambda_2, n_1\lambda_2\theta_1)B(n_{\Delta 2}\lambda_2, n_{\Delta 2}\lambda_2\theta_{\Delta 2}) \quad (46)$$

equally likely outcomes for the choice of socket connections and edge values under a fixed type $(n_1\theta_1, n_{\Delta 2}\theta_{\Delta 2})$.

A generating function $A_{<2>}(x)$ can be built for each of the $r_2$ check nodes. The combined generating function for all $r_2$ check nodes $A_{<2>}(x)^{r_2}$ is constructed such that the coefficient of the term $x^{n_1\lambda_1, n_2\lambda_2\theta_2}$, denoted by $\lfloor A_{<2>}(x)^{r_2}\rfloor_{n_1\lambda_1\theta_1, n_2\lambda_2\theta_2}$, describes the number of edge and socket assignments for which $c_{n_1\theta_1, n_{\Delta 2}\theta_{\Delta 2}}$ is a codeword. Notice that $n_1\lambda_1\theta_1$ represents the type of the $n_1\lambda_1$ sockets from the first $n_1$ variable nodes (added in stage-1 design), and $n_2\lambda_2\theta_2$ represents the type of the $n_2\lambda_2$ sockets from the whole $n_2$ variable nodes (added in stage-2 design). Therefore, $$Pr\left[c_{n_1\theta_1, n_{\Delta 2}\theta_{\Delta 2}} \in C_{(2)}\right] = \frac{\lfloor (A_{(2)}(x)^{r_2})\rfloor_{n_1\lambda_1\theta_1, n_2\lambda_2\theta_2}}{t((\theta_1, \theta_{\Delta 2}), n_2)} \quad (47)$$

Since the first $r_1$ check nodes are different from the incremental $r_{\Delta 2}$ check nodes in the sense that they have different numbers of sockets and can connect to different variable nodes, the generating function $A_{<2>}(x)^{r_2}$ can be separated into two categories $$A_{<2>}(x)^{r_2} = A_1(x)^{r_1} A_2(x_{2,1}, x_{2,2})^{r_{\Delta 2}},$$

and their coefficients satisfy $$\lfloor A_{<2>}(x)^{r_2}\rfloor_{n_1\lambda_1\theta_1, n_2\lambda_2\theta_2} = \lfloor A_1(x_1)^{r_1} A_2(x_{2,1}, x_{2,2})^{r_{\Delta 2}}\rfloor_{n_1\lambda_1\theta_1|n_1\lambda_2\theta_1, n_{\Delta 2}\lambda_2\theta_{\Delta 2}},$$

where $A_1(x_1)^{r_1}$ is the generating function for the first $r_1$ check nodes, and $A_2(x_{2,1}, x_{2,2})^{r_{\Delta 2}}$ is the generating function of the incremental $r_{\Delta 2}$ check nodes.

Whilst $A_1(x_1)^{r_1}$ corresponds to the generating function of a regular LDPC code, a direct calculation of $A_2(x_{2,1}, x_{2,2})$ might be challenging as it needs to be separated into different cases, depending on how many of the $\rho_2$ sockets are coming from the first $n_1$ variables nodes (corresponding to $x_{2,1}$ term) and how many of them are from the $n_{\Delta 2}$ variable nodes (corresponding to $x_{2,2}$ term).

To overcome this difficulty, the joint generating function $$\lfloor A_1(x_1)^{r_1} A_2(x_{2,1}, x_{2,2})^{r_{\Delta 2}}\rfloor_{n_1\lambda_1\theta_1|n_1\lambda_2\theta_1, n_{\Delta 2}\lambda_2\theta_{\Delta 2}} \quad (48)$$

can be broken into two independent generating functions as $$\lfloor A_1(x_1)^{r_1} A_2(x_{2,1}, x_{2,2})^{r_{\Delta 2}}\rfloor_{n_1\lambda_1\theta_1|n_1\lambda_2\theta_1, n_{\Delta 2}\lambda_2\theta_{\Delta 2}} = \lfloor A_1(x_1)^{r_1}\rfloor_{n_1\lambda_1\theta_1} \lfloor A_2(x_{2,1}, x_{2,2})^{r_{\Delta 2}}\rfloor_{n_1\lambda_2\theta_1, n_{\Delta 2}\lambda_2\theta_{\Delta 2}}. \quad (49)$$

The intuition behind breaking apart the generating function in this way is that the sockets for the first group of $r_{\Delta 1}$ check nodes can be independently drawn compared to the sockets for the second group of $r_{\Delta 2}$ check nodes. In other words, for any given sockets configuration that are satisfied with the first group of check nodes, it is possible to choose $\lfloor A_2(x_{2,1}, x_{2,2})^{r_{\Delta 2}}\rfloor_{n_1\lambda_2\theta_1, n_{\Delta 2}\lambda_2\theta_{\Delta 2}}$ different socket connections for the second group of check nodes, and all of them are typically satisfied with both groups of check nodes and thus give valid codewords.

Furthermore, given a type $n_2\theta_2$ and some compatible sub-type pair $(n_1\theta_1, n_{\Delta 2}\theta_{\Delta 2})$, that is, $\theta_1 \in S_{comp}(\theta_1|\theta_2)$ and $$\theta_{\Delta 2} = \frac{n_2\theta_2 - n_1\theta_1}{n_{\Delta 2}},$$

then $$\lfloor A_2(x_{2,1}, x_{2,2})^{r_{\Delta 2}}\rfloor_{n_1\lambda_2\theta_1, n_2\lambda_2\theta_2} = \lfloor A_2(x_2)^{r_{\Delta 2}}\rfloor_{n_2\lambda_2\theta_2} \cdot \frac{\binom{n_1}{n_1\theta_1}\binom{n_{\Delta 2}}{n_{\Delta 2}\theta_{\Delta 2}}}{\binom{n_2}{n_2\theta_2}}, \quad (50)$$

where $A_2(x_2)$ is the generating function for one check node in a regular LDPC code with parameter $(\lambda_2, \rho_2)$, and the coefficient of the term $x_2^{n_2\lambda_2\theta_2}$ can be taken in the generating function $A_2(x_2)^{r_{\Delta 2}}$.

The intuition behind this approach is that for any given fixed sequence of $n_2$ symbols of type $\theta_2 n_2$, the number of socket connections and edge values that satisfy the $r_{\Delta 2}$ check nodes are the same. However, it is only necessary to count the sequences such that the first $n_1$ symbols are of type $n_1\theta_1$ and the second incremental $n_{\Delta 2}$ symbols are of type $n_{\Delta 2}\theta_{\Delta 2}$. The total number of different length-$n_2$ sequences of type-$n_2\theta_2$ is the multinomial coefficient $\binom{n_2}{n_2\theta_2}$, and $\binom{n_1}{n_1\theta_1}\binom{n_{\Delta 2}}{n_{\Delta 2}\theta_{\Delta 2}}$ of them are consistent with the sub-type pair $(n_1\theta_1, n_{\Delta 2}\theta_{\Delta 2})$. In addition, since the contribution (that is, the number of socket connections and permutations that satisfies the check nodes) of every sequence is the same, the approach can be effective. Furthermore, the above approaches can be generalized to arbitrary k≥2

Applying the above approaches to $\lfloor A_{<2>}(x)^{r_2} \rfloor_{n_1\lambda_1\theta_1, n_2\lambda_2\theta_2}$ in (47), it is possible to obtain $$Pr[c_{n_1\theta_1, n_{\Delta 2}\theta_{\Delta 2}} \in C_{(2)}] = \quad (51)$$

$$\frac{\lfloor A_1(x_1)^{r_1} \rfloor_{n_1\lambda_1\theta_1} \lfloor A_2(x_2)^{r_{\Delta 2}} \rfloor_{n_2\lambda_2\theta_2} \cdot \dfrac{\binom{n_1}{n_1\theta_1}\binom{n_{\Delta 2}}{n_{\Delta 2}\theta_{\Delta 2}}}{\binom{n_2}{n_2\theta_2}}}{t((\theta_1, \theta_{\Delta 2}), n_2)}$$

$$= \frac{\lfloor A_1(x_1)^{r_1} \rfloor_{n_1\lambda_1\theta_1} \dfrac{\binom{n_1}{n_1\theta_1}\binom{n_{\Delta 2}}{n_{\Delta 2}\theta_{\Delta 2}}}{\binom{n_2}{n_2\theta_2}}}{B(n_1\lambda_1, n_1\lambda_1\theta_1)(q-1)^{n_1\lambda_1}} \cdot \quad (52)$$

$$\frac{\lfloor A_2(x_2)^{r_{\Delta 2}} \rfloor_{n_2\lambda_2\theta_2}}{B(n_1\lambda_2, n_1\lambda_2\theta_1)B(n_{\Delta 2}\lambda_2, n_{\Delta 2}\lambda_2\theta_{\Delta 2})(q-1)^{n_2\lambda_2}}.$$

Substituting (52) into (45) and combining with the $1/B(n_2, n_2\theta_2)$ factor from (41) gives $$\frac{\overline{S}_{L,r_2}^{n_2}(\theta_2)}{B(n_2, n_2\theta_2)} = \sum_{\theta_1 \in S_{comp}(\theta_1|\theta_2)} \frac{B(n_1, n_1\theta_1)B(n_{\Delta 2}, n_{\Delta 2}\theta_{\Delta 2})}{B(n_2, n_2\theta_2)} \cdot \quad (53)$$

$$\frac{\lfloor A_1(x_1)^{r_1} \rfloor_{n_1\lambda_1\theta_1} \dfrac{\binom{n_1}{n_1\theta_1}\binom{n_{\Delta 2}}{n_{\Delta 2}\theta_{\Delta 2}}}{\binom{n_2}{n_2\theta_2}}}{B(n_1\lambda_1, n_1\lambda_1\theta_1)(q-1)^{n_1\lambda_1}} \cdot$$

$$\frac{\lfloor A_2(x_2)^{r_{\Delta 2}} \rfloor_{n_2\lambda_2\theta_2}}{B(n_1\lambda_2, n_1\lambda_2\theta_1)B(n_{\Delta 2}\lambda_2, n_{\Delta 2}\lambda_2\theta_{\Delta 2})(q-1)^{n_2\lambda_2}}.$$

To bound each of the terms in (53), it is possible to take the log and divide by $n_2$ to find the "exponent". To do that, the following results are utilized:

1. For a given type $n\theta \in \mathcal{T}_Q^n$, $$H(\theta) - \frac{1}{n}\log B(n, n\theta) = O\left(\frac{\log n}{n}\right) \quad (54)$$

2. For an expurgated regular LDPC ensemble with parameter $(\lambda, \rho; n)$, $$\lim_{n\to\infty} \frac{1}{n}\log \lfloor (A(x))^{n\lambda/\rho} \rfloor_{n\lambda\theta} \leq \lambda H(\theta) + \lambda\log(q-1) - \frac{\lambda}{\rho} + O(b_0^{\kappa n}), \quad (55)$$

where $b_0 < 1$ is some constant that depends q and the expurgation threshold σ. In particular, choosing $$\kappa = \frac{\log\left(\frac{\log n}{n}\right)}{n\log(b_0)}$$

can ensure that $$O(b_0^{\kappa n}) = O\left(\frac{\log n}{n}\right).$$

3. For an expurgated LDPC ensemble, $$\max_{\theta: n\theta \in \mathcal{T}_Q^n}\left[\frac{1}{n}\log\lfloor (A(x))^{n\lambda/\rho} \rfloor_{n\lambda\theta} - \lim_{n\to\infty}\frac{1}{n}\log\lfloor (A(x))^{n\lambda/\rho} \rfloor_{n\lambda\theta}\right] = O\left(\frac{\log n}{n}\right). \quad (56)$$

Recall that $A_1(x_1)^{r_1}$ and $A_2(x_2)^{r_{\Delta 2}}$ are the generating functions for regular LDPC codes with parameter $(\lambda_1, \rho_1; n_1)$ and $(\lambda_2, \rho_2; n_2)$, respectively. With the assumption that $$\kappa_i = \frac{\lambda_i}{n_i}$$

decays no faster than $$\frac{\log\left(\frac{\log n_i}{n_i}\right)}{n_i \log b_i}$$

for $i \in [2]$, the following bounds can be found for each of the terms in (53).

Generating function $A_1(x_1)^{r_1}$:

$$\frac{1}{n_2}\log\lfloor A_1(x_1)^{r_1} \rfloor_{n_1\lambda_1\theta_1} \leq \quad (57)$$

$$\frac{n_1}{n_2}\left(\lambda_1 H(\theta_1) + \lambda_1\log(q-1) - \frac{\lambda_1}{\rho_1}\right) + O\left(\frac{\log n_1}{n_2}\right).$$

Generating function $A_2(x_2)^{r_{\Delta 2}}$:

$$\frac{1}{n^2}\log\lfloor A_2(x_2)^{r_{\Delta 2}} \rfloor_{n_2\lambda_2\theta_2} \leq \lambda_2 H(\theta_2) + \lambda_2\log(q-1) - \frac{\lambda_2}{\rho_2} + O\left(\frac{\log n_2}{n_2}\right). \quad (58)$$

Each of the multinomial coefficients:

$$\frac{1}{n_2}\log B(n_1\lambda_1, n_1\lambda_1\theta_1) = \frac{n_1}{n_2}\lambda_1 H(\theta_1) + O\left(\frac{\log n_1}{n_2}\right) \quad (59)$$

$$\frac{1}{n_2}\log B(n_1\lambda_2, n_1\lambda_2\theta_1) = \frac{n_1}{n_2}\lambda_2 H(\theta_1) + O\left(\frac{\log n_1}{n_2}\right), \quad (60)$$

and $$\frac{1}{n_2}\log B(n_{\Delta 2}\lambda_2, n_{\Delta 2}\lambda_2\theta_{\Delta 2}) = \frac{n_{\Delta 2}}{n_2}\lambda_2 H(\theta_2) + O\left(\frac{\log n_{\Delta 2}}{n_2}\right). \quad (61)$$

. The possible number of edge values $(q-1)^{n_1\lambda_1}$ and $(q-1)^{n_2\lambda_2}$:

$$\frac{1}{n_2}\log(q-1)^{n_1\lambda_1} = \frac{n_1}{n_2}\lambda_1\log(q-1) \tag{62}$$

$$\frac{1}{n_2}\log(q-1)^{n_2\lambda_2} = \lambda_2\log(q-1). \tag{63}$$

Note that the number of terms in the set $\mathcal{S}_{comp}(\theta_1|\theta_2)$ can grow polynomially in blocklength, while the number of codewords grows exponentially in blocklength, to obtain that $$\lim_{n_1\to\infty}\max_{\theta_2:\theta_2 n_2 \in \mathcal{T}_Q^{n_2}} \frac{\overline{S}_{L,r_2}^{n_2}(\theta_2)}{B(n_2, n_2\theta_2)} =$$
$$\lim_{n_1\to\infty}\max_{\theta_2:\theta_2 n_2 \in \mathcal{T}_Q^{n_2}} \sum_{\theta_1\in\mathcal{S}_{comp}(\theta_1|\theta_2)} \frac{\overline{S}_{L,r_2}^{n_2}(\theta_1,\theta_{\Delta 2})}{B(n_2, n_2\theta_2)}$$

$$= \lim_{n_1\to\infty}\max_{\theta_2:\theta_2 n_2 \in \mathcal{T}_Q^{n_2}} \max_{\theta_1\in\mathcal{S}_{comp}(\theta_1|\theta_2)} \frac{\overline{S}_{L,r_2}^{n_2}(\theta_1,\theta_{\Delta 2})}{B(n_2, n_2\theta_2)}. \tag{65}$$

Combining the results from (57) to (63), for large-enough blocklength $n_1$ provides $$\max_{\theta_2:\theta_2 n_2 \in \mathcal{T}_Q^{n_2}} \frac{1}{n_2}\log\frac{\overline{S}_{L,r_2}^{n_2}(\theta_2)}{B(n_2,n_2\theta_2)} \leq \tag{66}$$

$$\max_{\theta_2:\theta_2 n_2 \in \mathcal{T}_Q^{n_2}} \max_{\theta_1 \in \mathcal{S}_{comp}(\theta_1|\theta_2)} \cdot \frac{1}{n_2}\log\left(\frac{B(n_1, n_1\theta_1)B(n_{\Delta 2}, n_{\Delta 2}\theta_{\Delta 2})}{B(n_2, n_2\theta_2)}\right)^2 -$$

$$\frac{n_1}{n_2}\frac{\lambda_1}{\rho_1} - \frac{\lambda_2}{\rho_2} + \lambda_2 H(\theta_2) - \frac{n_1}{n_2}\lambda_2 H(\theta_1) - \frac{n_{\Delta 2}}{n_2}\lambda_2 H(\theta_2) + O\left(\frac{\log n_2}{n_2}\right)$$

$$\leq -\frac{n_1}{n_2}\frac{\lambda_1}{\rho_1} - \frac{\lambda_2}{\rho_2} + O\left(\frac{\log n_2}{n_2}\right), \tag{67}$$

where (67) follows from the fact that $$\log\frac{B(n_1, n_1\theta_1)B(n_{\Delta 2}n_{\Delta 2}\theta_{\Delta 2})}{B(n_2, n_2\theta_2)} \leq \log 1 = 0$$

for all $\theta_1\in\mathcal{S}_{comp}(\theta_1|\theta_2)$ and $$\max_{\theta_2:\theta_2 n_2 \in \mathcal{T}_Q^{n_2}} \max_{\theta_1\in\mathcal{S}_{comp}(\theta_1|\theta_2)}\left[\lambda_2 H(\theta_2) - \frac{n_1}{n_2}\lambda_2 H(\theta_1) - \frac{n_{\Delta 2}}{n_2}\lambda_2 H(\theta_2)\right] \tag{68}$$

$$= \max_{\theta_2:\theta_2 n_2 \in \mathcal{T}_Q^{n_2}} \max_{\theta_1\in\mathcal{S}_{comp}(\theta_1|\theta_2)} \frac{\lambda_2 n_1}{n_2}(H(\theta_2) - H(\theta_1)) \tag{69}$$

$$= 0. \tag{70}$$

Here (70) follows from the fact $\theta_1$ can always be chosen to be more uniform than $\theta_2$, as it can use all the elements from $n_2\theta_2$, and it only needs to construct a shorter sequence of length $n_1$.

Finally, substituting (67) back into the expression of $$\frac{\log \alpha_2}{n_2}$$

in (41), the following is obtained for large enough blocklength $n_1$ $$\frac{\log \alpha_2}{n_2} = \frac{1}{n_2}\log\frac{1}{(q^{n_2 R_2}-1)q^{-n_2}} - \frac{n_1}{n_2}\frac{\lambda_1}{\rho_1} - \frac{\lambda_2}{\rho_2} + O\left(\frac{\log n_2}{n_2}\right) \tag{71}$$

$$= (1-R_2) + O\left(\frac{1}{n_2 q^{n_2 R_2}}\right) - \frac{n_1}{n_2}\frac{\lambda_1}{\rho_1} - \frac{\lambda_2}{\rho_2} + O\left(\frac{\log n_2}{n_2}\right) \tag{72}$$

$$= \frac{r_2}{n_2} - \frac{n_1}{n_2}\frac{\lambda_1}{\rho_1} - \frac{\lambda_2}{\rho_2} + O\left(\frac{\log n_2}{n_2}\right) \tag{73}$$

$$= \frac{1}{n_2}\left(r_2 - \frac{n_1\lambda_1}{\rho_1} - \frac{n_2\lambda_2}{\rho_2}\right) + O\left(\frac{\log n_2}{n_2}\right) \tag{74}$$

$$= \frac{1}{n_2}(r_2 - r_1 - r_{\Delta 2}) + O\left(\frac{\log n_2}{n_2}\right) \tag{75}$$

$$= O\left(\frac{\log n_2}{n_2}\right). \tag{76}$$

where (72) follows from the Taylor series expansion of $\log(1-1/q^{n_2 R_2})$, (73) applies the definition of $R_2$ from (26), and (76) follows from the relationship between the LDPC parameters.

The above arguments can be generalized to arbitrary $k\in[K]$ using the same approach. The rate-offset $$\frac{\log \alpha_k}{n_k}$$

goes to 0 as $n_1$ goes to infinity. Furthermore, the rate offset behaves as $$O\left(\frac{\log n_k}{n_k}\right)$$

for large enough $n_1$ provided the densities $$\kappa_i = \frac{\lambda_i}{n_i}$$

decays no faster than $$\frac{\log\left(\frac{\log n_i}{n_i}\right)}{n_i \log b_i}$$

for all $i\in[k]$.

The term $O(b_i^{\kappa_i n_i})$ can be made to behave as some target function $O(f(n_i))$ by setting $$b_i^{\kappa_i n_i} = f(n_i) \tag{77}$$

$$\kappa_i n_i \log b_i = \log f(n_i) \tag{78}$$

$$\kappa_i = \frac{\log f(n_i)}{n_i \log b_i}. \tag{79}$$

For example, if it is desired that $$O(b_i^{\kappa_i n_i}) = O\left(\frac{\log n_i}{n_i}\right)$$

(the third-order term in (92)), then $$\kappa_i = \frac{\log\left(\frac{\log n_i}{n_i}\right)}{n_i \log(b_i)}.$$

Similarly, if the design objective only requires $$O(b_i^{\kappa_i n_i}) = O\left(\frac{1}{\sqrt{n_i}}\right)$$

(dispersion, or the second-order term in (92)), then a smaller $$\kappa_i = \frac{\log\left(\frac{1}{\sqrt{n_i}}\right)}{n_i \log(b_i)}$$

is needed (recall that $b_i < 1$, hence $\log b_i < 0$).

Therefore, systems and methods in accordance with various embodiments of the invention can utilize the best $\kappa_i$ that suits a particular performance objective $O(f(n_i))$ using equation (79). Conversely, the effect of a given density $\kappa_i$ can be determined using the expression $O(b_i^{\kappa_i n_i})$.

A combined generating function can be expressed as follows $$\lfloor A_1(x_1)^{r_1} \quad \ldots \quad , A_k(x_{k,1}, \quad x_{k,k})^{r_{\Delta k}} \rfloor_{n_1 \lambda_1 \theta_1 | \ldots | n_1 \lambda_k \theta_1, \ldots, n_{\Delta k} \lambda_k \theta_{\Delta k}}$$

and can be broken into k independent generating functions as $$\lfloor A_1(x_1)^{r_1} \ldots \ldots, A_k(x_{k,1}, x_{k,k})^{r_{\Delta k}} \rfloor_{n_1 \lambda_1 \theta_1 | \ldots | n_1 \lambda_k \theta_1, \ldots, n_{\Delta k} \lambda_k \theta_{\Delta k}} = \tag{80}$$

$$\lfloor A_1(x_1)^{r_1} \rfloor_{n_1 \lambda_1 \theta_1} \cdot \prod_{i=2}^{k} \lfloor A_k(x_{i,1}, \ldots, x_{i,i})^{r_{\Delta i}} \rfloor_{n_1 \lambda_i \theta_1, \ldots, n_{\Delta i} \lambda_k \theta_{\Delta i}}.$$

Given a type $\theta_k n_k$ and a compatible sub-type pair $(n_1 \theta_1, n_{\Delta 2} \theta_{\Delta 2}, \ldots, n_{\Delta k} \theta_{\Delta k})$, then $$\lfloor A_k(x_{k,1}, \ldots, x_{k,k})^{r_{\Delta k}} \rfloor_{n_1 \lambda_k \theta_1, \ldots, n_{\Delta k} \lambda_k \theta_{\Delta k}} = \tag{81}$$

$$\lfloor A_k(x_k)^{r_{\Delta k}} \rfloor_{n_k \lambda_k \theta_k} \cdot \frac{\prod_{i=1}^{k}\binom{n_{\Delta i}}{n_{\Delta i} \theta_{\Delta i}}}{\binom{n_k}{n_k \theta_k}},$$

where $A_k(x_k)$ is the generating function for one check node in a regular LDPC code with parameter $(\lambda_k, \rho_k)$, and the coefficient of the term $x_k^{n_k \lambda_k \theta_k}$ is taken in the generating function $A_k(x_2)^{r_{\Delta k}}$.

Due to the nature of the quantizer $\delta: GF(q) \to \mathcal{X}$, the resulting distribution $P_X^q(x)$ is an integer multiple of $1/q$ for each $x \in \mathcal{X}$. When the capacity-achieving distribution $P_X^*$ is not an integer multiple of $1/q$ for some small q (e.g., some $P_X^*(x)$ are irrational), then a large q may be necessary to make the approximation of $P_X^q$ to $P_X^*$ accurate.

For any DM-PPC $(\mathcal{X}, P_{Y|X}, \mathcal{Y})$ with capacity-achieving distribution $P_X^* \in \mathcal{P}\mathcal{X}$, where $$\mathcal{P}_X \triangleq \left\{(p_x : x \in \mathcal{X}) \in \mathbb{R}^{|\mathcal{X}|} : 0 \le p_x \le 1, \sum_{x \in \mathcal{X}} p_x = 1\right\}. \tag{82}$$

the set of distributions achievable with the use of a quantizer can be denoted as $\delta: GF(q) \to \mathcal{X}$ by $\mathcal{P}\mathcal{X}^q$, where $$\mathcal{P}_X^q \triangleq \left\{(p_x : x \in \mathcal{X}) \in \mathbb{Q}^{|\mathcal{X}|} : p_x = \frac{m_x}{q}, \sum_{x \in \mathcal{X}} m_x = q\right\}, \tag{83}$$

and $m_x \in [0:q]$ for all $x \in \mathcal{X}$, then $$\max_{P_X^* \in \mathcal{P}_X} \min_{P_X^q \in \mathcal{P}_X^q} I(P_X^*) - I(P_X^q) = O\left(\frac{\log q}{q}\right). \tag{84}$$

Furthermore, given any DM-PPC $(\mathcal{X}, P_{Y|X}, \mathcal{Y})$ with capacity-achieving distribution $P_X^* \in \mathcal{P}\mathcal{X}$ and a quantizer $\delta: GF(q) \to \mathcal{X}$, with $\mathcal{P}\mathcal{X}$ and $\mathcal{P}\mathcal{X}^q$ be defined in the same manner as above, $|\mathcal{X}| = a$ and $\lfloor |\mathcal{X}|/2 \rfloor = b$ can be denoted to obtain $$\max_{P_X^* \in \mathcal{P}_X} \min_{P_X^q \in \mathcal{P}_X^q} \sum_{x \in \mathcal{X}} |P_X^*(x) - P_X^q(x)| = \frac{1}{q} \frac{2b(a-b)}{a}. \tag{85}$$

When $P_1$ and $P_2$ be two distributions on $\mathcal{X}$ such that $$\sum_{x \in \mathcal{X}} |P_1(x) - P_2(x)| \le s \le \frac{1}{2}, \tag{86}$$

then $$|H(P_1) - H(P_2)| \leq -s \log \frac{s}{|\mathcal{X}|}, \quad (87)$$

where $H(P_X) \triangleq -\Sigma_{x \in \mathcal{X}} P_X(x) \log P(x)$ is the entropy of $P_X$.

Dispersion-Style Analysis

The dispersion-style approach bounds the fundamental limits (both achievability and converse) of the maximum rate in the finite-blocklength regime succinctly using the mutual information $I(P_X)$ and the channel dispersion $V(P_X)$ defined in (4) and (6).

Notably, the random coding union bound (RCU) bound, can be generalized to analyze random codes with statistically dependent codewords for the PPC and for the 2-transmitter MAC. Application of the generalized RCU bound yields new achievability results for the LDPC codes, matching the optimal codes for the first- and second-order performance in the DM-PPC and identical to the most performant prior results in the DM-MAC. A generalized RCU bound for a k-transmitter MAC can be utilized to obtain an achievability result for the use of RA-LDPC codes in a symmetric DM-k-MAC.

Consider an ensemble of k-transmitter MAC codes with $(M_k)^k$ codewords drawn according to $\Pi_{i=1}^k P_{X_i(1) X_i(2) \ldots X_i(M_k)}$ such that $$P_{X_i(\mathcal{A})} = P_{X_i(\mathcal{B})}, \quad \forall i \in [k], \quad \mathcal{A},$$
$$\mathcal{B} \subseteq [(M_k)^k] \text{ s.t. } |\mathcal{A}| = |\mathcal{B}|. \quad (88)$$

The ensemble-average error probability $\epsilon_k$ under ML decoding can satisfy $$\epsilon_k \leq \mathbb{E}\left[\min\left\{1, \sum_{\mathcal{S} \in 2^{[k]}: \mathcal{S} \neq \emptyset} (M_k - 1)^{|\mathcal{S}|} \cdot Pr\left[i(\overline{X}_\mathcal{S}; Y_k | X_{\mathcal{S}^c}) \geq i(X_\mathcal{S}; Y_k | X_{\mathcal{S}^c}) | X_{[k]}, Y_k\right]\right\}\right], \quad (89)$$

where $\mathcal{S}^c = [k] \setminus \mathcal{S}$, and $$P_{X_{[k]} \bar{X}_{[k]} Y_k}(a^k b^k c) = P_{X_{[k]} \bar{X}_{[k]}}(a^k b^k) P_{Y_k | X^k}(c | a^k) \quad (90)$$

$$P_{X_{[k]} \bar{X}_{[k]}}(a^k b^k) = \prod_{i=1}^k P_{X_i(1) X_i(2)}(a_i, b_i). \quad (91)$$

The RCU bound described above assumes that each transmitter has exactly the same number of codewords $M_k$. That is, the k-MAC is operating at the symmetrical rate points. The reasoning behind this assumption is to avoid confusions with using $M_1, \ldots, M_k$ to denote the size of the RAC codebooks at each blocklength $n_1, \ldots, n_k$.

Given a DM-RAC $\{(\mathcal{X}^k, P_{Y_k | X^k}, \mathcal{Y}_k)\}_{k=0}^K$, where a single distribution $P_X^*$ achieves the capacity for all possible number of active transmitters $k \in [K]$, a selection can be made so that $\delta : GF(q) \rightarrow \mathcal{X}$ is a quantization matched to $P_X^*$. In this case, there can exist LDPC parameters $(\lambda_k; \rho_k)_{k=1}^K$ for which the quantized coset-shifted LDPC-$\{(\lambda_i; \rho_i; n_i)\}_{i=1}^K$ ensemble contains at least one code with average error bounded by $\epsilon_k$ and $$R_k \geq \frac{1}{k} I(P_{X_{[k]}}^*) - \frac{1}{k} \sqrt{\frac{V(P_{X_{[k]}}^*)}{n_k}} Q^{-1}(\epsilon_k) + \frac{1}{k} \frac{\log n_k}{2 n_k} - \frac{\log \alpha_k}{n_k} - O\left(\frac{1}{n_k}\right), \quad (92)$$

for each possible number of active transmitters $k \in [K]$, where $I(P_{X_{[k]}}^*)$ and $V(P_{X_{[k]}}^*)$ are the mutual information and channel dispersion defined in (4) and (6) for input distribution $P_{X_{[k]}}^* = (P_X^*)^k$, $\alpha_k$ is defined in (41), and $R_k$ is the design rate at blocklength $n_k$ $$R_k = 1 - \frac{\sum_{i=1}^K \frac{n_i}{n_K} \lambda_i}{\sum_{i=1}^K \frac{r_{\Delta i}}{r_K} \rho_i} = \frac{\log M_k}{n_k}, \quad (93)$$

provided the following moment assumptions are satisfied $$I(P_{X_{[k]}}^*) > 0 \quad (94)$$

$$V^Y(P_{X_{[k]}}^*) > 0 \quad (95)$$

$$T(P_{X_{[k]}}^*) < \infty \quad (96)$$

$$T^Y(P_{X_{[k]}}^*) < \infty. \quad (97)$$

Compared to i.i.d. random codes, the additional penalty for the proposed LDPC codes $$-\frac{\log \alpha_k}{n_k}$$

behaves as $$O\left(\frac{\log n_k}{n_k}\right)$$

under minimum sparsity condition, i.e., $$\kappa_i = \frac{\rho_i}{n_i}$$

decays no more quickly than $$\frac{\log\left(\frac{\log n_i}{n_i}\right)}{n_i \log b_i}$$

for all $i \in [k]$. Accordingly, the proposed LDPC code achieves the same first- and second-order performance as i.i.d. random codes.

Although the present invention has been described in certain specific aspects, many additional modifications and variations would be apparent to those skilled in the art. It is therefore to be understood that the present invention can be practiced otherwise than specifically described including using different varieties of LDPC codes, using additional outer codes in combination with an LDPC code such as (but not limited to) a nested LDPC code without departing from the scope and spirit of the present invention. Thus, embodiments of the present invention should be considered in all respects as illustrative and not restrictive. Accordingly, the scope of the invention should be determined not by the embodiments illustrated, but by the appended claims and their equivalents.

What is claimed is:

1. A communication system, comprising:
   at least one encoder configured to:
   receive a start of epoch message;
   encode message data as symbols using a rateless code determined using a nested Low Density Parity Check (LDPC) code by mapping a codeword to a symbol, wherein the nested LDPC code:
   is an LDPC code with a full blocklength; and
   comprises one or more shorter blocklength LDPC codes; and
   receive feedback messages at a predetermined set of potential decoding times, wherein the at least one encoder is configured to transmit symbols until a received feedback message is an end of epoch message; and
   a decoder, where the decoder is configured to:
   cause a broadcast transmitter to transmit at least one start of epoch message;
   receive observed symbols;
   at each of a set of predetermined decode times, determine whether a decoding rule is satisfied; and
   when the decoding rule is satisfied:
   decode at least one message based upon the received observed symbols based upon the nested LDPC code; and
   cause the broadcast transmitter to transmit an end of epoch message.

2. The communication system of claim 1, wherein:
   the full blocklength corresponds to a longest decode time from the set of predetermined decode times; and
   each of the one or more shorter blocklength LDPC codes corresponds to a decode time from the set of predetermined decode times that is shorter than the longest decode time from the set of predetermined decode times.

3. The communication system of claim 1, wherein:
   the one or more shorter blocklength LDPC codes comprise a first shorter blocklength LDPC code and a second shorter blocklength LDPC code;
   the first shorter blocklength LDPC code comprises a first set of variable nodes, and a first set of check nodes; and
   the second shorter blocklength LDPC code comprises:
   a second set of variable nodes comprising: the first set of variable nodes and an incremental set of variable nodes; and
   a second set of check nodes comprising: the first set of check nodes, and an incremental set of check nodes.

4. The communication system of claim 3, wherein:
   the first set of check nodes are connected to one or more variable nodes from the first set of variable nodes; and
   the incremental set of check nodes are connected to one or more variable nodes from the second set of variable nodes.

5. The communication system of claim 3, wherein a ratio of the first set of variable nodes to the first set of check nodes is different from a ratio of the second set of variable nodes to the second set of check nodes.

6. The communication system of claim 1, wherein determining whether a decoding rule is satisfied is based upon the received observed symbols.

7. The communication system of claim 1, wherein the at least one encoder is configured to select a specific nested LDPC code based upon the start of epoch message.

8. The communication system of claim 1, wherein:
   the at least one encoder is a plurality of encoders; and
   multiple encoders in the plurality of encoders are configured to select the same nested LDPC code to use when encoding the message data as symbols using the rateless code.

9. The communication system of claim 1, wherein:
   the at least one encoder is a plurality of encoders; and
   at least two of the plurality of encoders are configured to select different nested LDPC codes to use when encoding the message data as symbols using the rateless code.

10. The communication system of claim 9, wherein at least two of the different nested LDPC codes have different code rates.

* * * * *

UNITED STATES PATENT AND TRADEMARK OFFICE
CERTIFICATE OF CORRECTION

| | | |
|---|---|---|
| PATENT NO. | : 12,119,932 B2 | Page 1 of 1 |
| APPLICATION NO. | : 17/146343 | |
| DATED | : October 15, 2024 | |
| INVENTOR(S) | : Michelle Effros and Yuxin Liu | |

It is certified that error appears in the above-identified patent and that said Letters Patent is hereby corrected as shown below:

In the Claims

Column 35: Claim 1, Line 14 add a --the-- before "symbols"; Claim 1, Line 27 replace "an end" with --the end--.

Column 36: Claim 6, Line 20 replace "a decoding" with --the decoding--; Claim 8, Line 29 add a --the-- before "symbols"; Claim 9, Line 35 add a --the-- before "symbols".

Signed and Sealed this
Sixteenth Day of December, 2025

John A. Squires
*Director of the United States Patent and Trademark Office*